United States Patent
Song et al.

(10) Patent No.: US 9,530,739 B2
(45) Date of Patent: Dec. 27, 2016

(54) PACKAGE ON PACKAGE (POP) DEVICE COMPRISING A HIGH PERFORMANCE INTER PACKAGE CONNECTION

(71) Applicant: QUALCOMM Incorporated, San Diego, CA (US)

(72) Inventors: Young Kyu Song, San Diego, CA (US); Kyu-Pyung Hwang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 6 days.

(21) Appl. No.: 14/609,289

(22) Filed: Jan. 29, 2015

(65) Prior Publication Data

US 2016/0172302 A1 Jun. 16, 2016

Related U.S. Application Data

(60) Provisional application No. 62/092,140, filed on Dec. 15, 2014.

(51) Int. Cl.
*H01L 23/00* (2006.01)
*H01L 23/538* (2006.01)
(Continued)

(52) U.S. Cl.
CPC ......... *H01L 23/5384* (2013.01); *H01L 21/768* (2013.01); *H01L 23/5386* (2013.01); *H01L 23/5389* (2013.01); *H01L 23/552* (2013.01); *H01L 23/60* (2013.01); *H01L 24/00* (2013.01); *H01L 25/0657* (2013.01); *H01L 25/105* (2013.01); *H01L 25/50* (2013.01); *H01L 2224/16227* (2013.01); *H01L 2224/32225* (2013.01); *H01L 2224/73204* (2013.01); *H01L 2225/1023* (2013.01); *H01L 2225/1047* (2013.01); *H01L 2924/15311* (2013.01)

(58) Field of Classification Search
CPC ...................................................... H01L 25/16
See application file for complete search history.

(56) References Cited

U.S. PATENT DOCUMENTS 6,803,252 B2 10/2004 Lao et al.
7,586,183 B2 9/2009 Kawabata et al.
(Continued)

OTHER PUBLICATIONS

International Search Report and Written Opinion—PCT/US2015/065294—ISA/EPO—Apr. 22, 2016.

*Primary Examiner* — William Harriston
(74) *Attorney, Agent, or Firm* — Loza & Loza, LLP

(57) ABSTRACT

A package on package (PoP) device includes a first package and a second package. The first package includes a first package substrate, a die coupled to the first package substrate, an encapsulation layer located on the first package substrate, and an inter package connection coupled to the first package substrate. The inter package connection is located in the encapsulation layer. The inter package connection includes a first interconnect configured to provide a first electrical path for a reference ground signal, and a second set of interconnects configured to provide at least one second electrical path for at least one second signal. The first interconnect has a length that is at least about twice as long as a width of the first interconnect. The second set of interconnects is configured to at least be partially coupled to the first interconnect by an electric field.

30 Claims, 20 Drawing Sheets

(51) Int. Cl.
*H01L 21/768* (2006.01)
*H01L 25/065* (2006.01)
*H01L 25/00* (2006.01)
*H01L 23/552* (2006.01)
*H01L 23/60* (2006.01)
*H01L 25/10* (2006.01)

(56) References Cited

U.S. PATENT DOCUMENTS

| | | |
|---|---|---|
| 7,964,972 B2 | 6/2011 | Matsui |
| 8,344,512 B2 | 1/2013 | Knickerbocker |
| 8,344,515 B2 | 1/2013 | Nishio et al. |
| 2009/0134500 A1 | 5/2009 | Kuo |
| 2010/0230806 A1* | 9/2010 | Huang .................... H01L 23/50 257/723 |
| 2012/0223788 A1 | 9/2012 | Altunkilic et al. |
| 2014/0167262 A1 | 6/2014 | Yap |

* cited by examiner

PLAN VIEW

PLAN VIEW

PLAN VIEW

PACKAGE ON PACKAGE (POP) DEVICE COMPRISING A HIGH PERFORMANCE INTER PACKAGE CONNECTION

CLAIM OF PRIORITY/CLAIM OF BENEFIT

The present application claims priority to U.S. Provisional Application No. 62/092,140 titled "Package on Package (PoP) Device Comprising a High Performance Inter Package Connection", filed Dec. 15, 2014, which is hereby expressly incorporated by reference herein.

BACKGROUND

Field

Various features relate to a package on package (PoP) device that includes a high performance inter package connection.

Background

FIG. 1 illustrates a package on package (PoP) device 100. The PoP device 100 includes a first package 102 and a second package 104. The first package 102 includes a first die 120 and a first package substrate 122. The second package 104 includes a second die 140 and a second package substrate 142. As shown in FIG. 1, the second package 104 is coupled to the first package 102 through a set of solder balls 150.

One drawback of the PoP device 100 of FIG. 1 is that the set of solder balls 150 are an inefficient type of package to package interconnects. Due to their size and configuration, solder balls are not ideal for providing high quality and/or high performance signals, which can limit the communication bandwidth and/or performance of package to package interconnects. In addition, solder balls have limited functionality and configuration. For example, a single solder ball can only transmit one electrical signal. Moreover, neighboring solder balls, due to their size and proximity to each other, are prone to interference with each other, resulting in lower electrical signal quality and/or performance.

Therefore, there is a need for a package on package (PoP) device that can provide better quality and/or performance signals between packages. Ideally, such a PoP device will have a better form factor, while at the same time meeting the needs and/or requirements of mobile and/or wearable devices.

SUMMARY

Various features, apparatus and methods described herein a package on package (PoP) device that includes a high performance inter package connection.

A first example provides an integrated device package that includes a first package substrate, a first die coupled to the first package substrate, an encapsulation layer located on the first package substrate, and an inter package connection coupled to the first package substrate. The inter package connection is located at least partially in the encapsulation layer. The inter package connection includes a first interconnect configured to provide a first electrical path for a reference ground signal. The first interconnect has a length that is at least about twice as long as a width of the first interconnect. The inter package connection also includes a second set of interconnects configured to provide at least one second electrical path for at least one second signal. The second set of interconnects is configured to at least be partially coupled to the first interconnect by an electric field.

A second example provides an integrated device package that includes a first package substrate, a first die coupled to the first package substrate, an encapsulation layer located on the first package substrate, and an inter package connection coupled to the first package substrate. The inter package connection is located at least partially in the encapsulation layer. The inter package connection includes a first interconnect configured to provide a first electrical path for a reference ground signal. The first interconnect has a length that is at least about twice as long as a width of the first interconnect. The inter package connection also includes an electrical vertical coupling means configured to provide at least one second electrical path for at least one second signal. The first interconnect and the electrical vertical coupling means are positioned in the encapsulation layer.

A third example provides a package on package (PoP) device that includes a first integrated device package and a second integrated device package coupled to the first integrated device package. The first integrated device package includes a first package substrate, a first die coupled to the first package substrate, an encapsulation layer located on the first package substrate, and an inter package connection coupled to the first package substrate. The inter package connection is located at least partially in the encapsulation layer. The inter package connection includes a first interconnect configured to provide a first electrical path for a reference ground signal. The first interconnect has a length that is at least about twice as long as a width of the first interconnect. The inter package connection also includes a second set of interconnects configured to provide at least one second electrical path for at least one second signal. The second set of interconnects is further configured to at least be partially coupled to the first interconnect by an electric field.

A fourth example provides a method for fabricating a device. The method fabricates a first integrated device package, where fabricating the first integrated device package includes providing a first package substrate, coupling a first die to the first package substrate, forming an encapsulation layer on the first package substrate, and providing an inter package connection to the first package substrate and at least partially in the encapsulation layer. The method of providing the inter package connection includes forming a first interconnect in the encapsulation layer. The first interconnect is formed to provide a first electrical path for a reference ground signal. The first interconnect has a length that is at least about twice as long as a width of the first interconnect. The method of providing the inter package connection includes forming a second set of interconnects in the encapsulation layer. The second set interconnects is formed to provide at least one second electrical path for at least one second signal. The second set of interconnects is formed to at least be partially coupled to the first interconnect by an electric field.

DRAWINGS

Various features, nature and advantages may become apparent from the detailed description set forth below when taken in conjunction with the drawings in which like reference characters identify correspondingly throughout.

DETAILED DESCRIPTION

Figure 1:
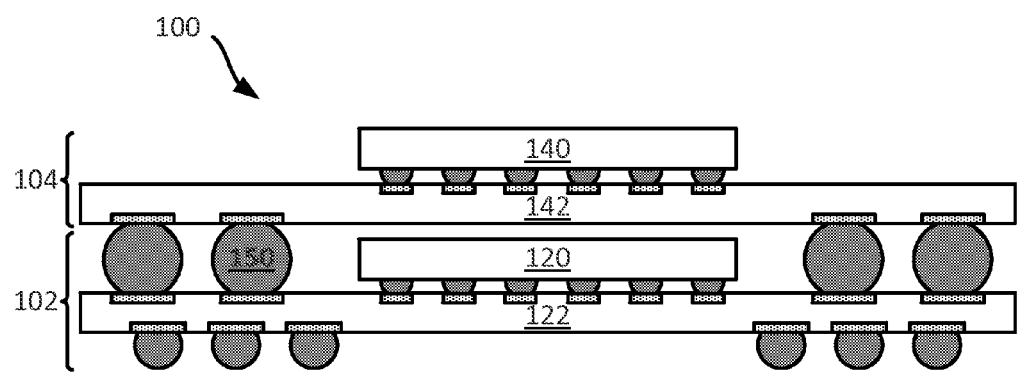
FIG. 1 illustrates a package on package (PoP) device.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to a package on package (PoP) device that includes a first integrated device package and a second integrated device package. The first integrated device package includes a first package substrate, a first die coupled to the first package substrate, an inter package connection coupled to the first package substrate, and an encapsulation layer encapsulating the inter package connection. The inter package connection includes a first set of interconnects configured to provide a first electrical path for a reference ground signal, and a second set of interconnects configured to provide a second electrical path for a second signal. The first electrical path includes a first lateral direction in the inter package connection. The second interconnect is free of direct contact with the first interconnect. The second interconnect is further configured to at least partially electrically coupled to the first interconnect (e.g., by an electric field) when the second signal traverses the second interconnect. The second integrated device package is coupled to the first integrated device package. The second integrated device package includes a second package substrate, a second die coupled to the second package substrate. In some implementations, the inter package connection further includes a dielectric layer (e.g., a silicon layer/material, glass layer/material). The inter package connection at least partially surrounds the first die. In some implementations, the inter package connection further includes a third set of interconnects, the first and third set of interconnects are configured to provide the first electrical path for the reference ground signal. In some implementations, the first and third set of interconnects at least partially surround the second set of interconnects. In some implementations, the inter package connection is an inter package coaxial connection.

An interconnect is an element or component of a device (e.g., integrated device, integrated device package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

Figure 2:
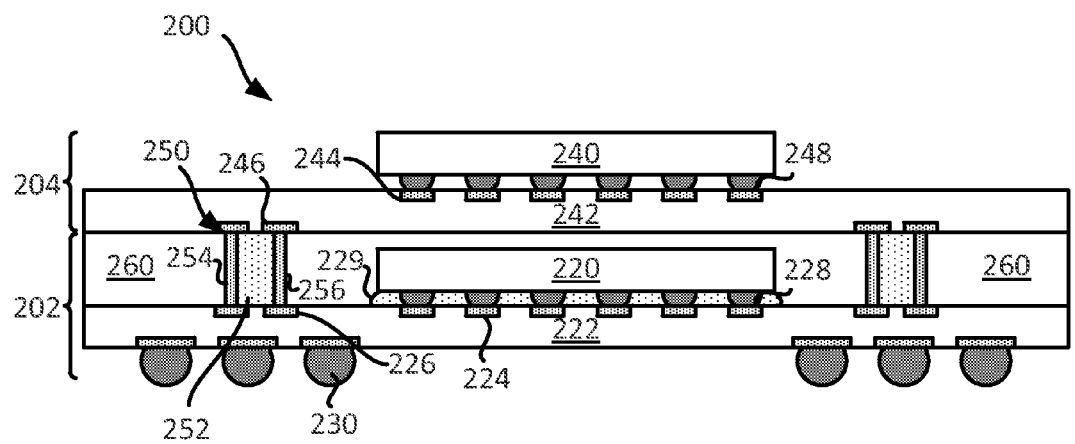
FIG. 2 illustrates a profile view of a package on package (PoP) device that includes an inter package connection.

Exemplary Package on Package (PoP) Device Comprising High Performance Inter Package Connection FIG. 2 illustrates a package on package (PoP) device 200 that includes a inter package connection. The PoP device 200 includes a first package 202 (e.g., first integrated device package) and a second package 204 (e.g., second integrated device package). The first package 202 includes a first die 220, a first package substrate 222, an inter package connection 250, and an encapsulation layer 260. The second package 204 includes a second die 240 and a second package substrate 242.

The first package substrate 222 includes a first set of pads 224 and a second set of pads 226. The first package substrate 222 may include one or more dielectric layers. The first package substrate 222 may include several interconnects (e.g., traces, vias, pads), which are not shown. The first die 220 is coupled to the first package substrate 222 through a first set of solder balls 228. Specifically, the first die 220 is coupled to the first set of pads 224 through the first set of solder balls 228. In some implementations, the first die 220 may be coupled to the substrate 222 differently. For example, the first die 220 may be coupled to the substrate 222 through a set of pillars. An underfill 229 surrounds the first set of solder balls 228. A second set of solder balls 230 is coupled to the first package substrate 222.

The encapsulation layer 260 encapsulates the first die 220. The inter package connection 250 is at least partially embedded in the encapsulation layer 260. The inter package connection 250 includes a dielectric layer 252, a first set of interconnects 254, and a second set of interconnects 256. The first set of interconnects 254 may include one or more first interconnects. The second set of interconnects 256 may include one or more second interconnects. The inter package connection 250 vertically traverses the encapsulation layer 260. The dielectric layer 252 may include one of at least a silicon material, and/or a glass material. The dielectric layer 252 may be an electrical isolation means. In some implementations, the inter package connection 250 is an electrical coupling means (e.g., inter package connection means). The electrical coupling means may include a dielectric layer. The electrical coupling means may at least partially surround the die 220. The electrical coupling means may be an inter package coaxial connection means. The first set of interconnects 254 and the second set of interconnects 256 vertically traverse the encapsulation layer 260. The electrical coupling means may include an electrical lateral coupling means and an electrical vertical coupling means. In some implementations, the electrical vertical coupling means is configured to provide an electrical path for a signal along a vertical direction. In some implementations, the electrical lateral coupling means is configured to provide an electrical path for a signal along a lateral direction.

A vertical direction is a direction in between two substrates (e.g., between two package substrates) of a package-on-package (PoP) device. In some implementations, a vertical direction is a direction perpendicular to a first surface of a substrate. In some implementations, the first surface of the substrate may be a surface of the substrate comprising the largest surface area. In some implementations, a lateral direction is a direction perpendicular to the vertical direction. In some implementations, a lateral direction is a direction along (e.g., parallel to) the first surface of a surface, where the first surface may be a surface of the substrate comprising the largest surface area.

In some implementations, the inter package connection 250 at least partially surrounds (e.g., laterally surrounds) the first die 220. In some implementations, the first set of interconnects 254 is a solid piece of electrically conductive material (e.g., metal slab) that at least partially surrounds the first die 220. In some implementations, the second set of interconnects 256 includes several vias (e.g., through encapsulation vias) that at least partially surrounds the first die 220. The second set of interconnects 256 is located between the first set of interconnects 254 and the first die 220. In some implementations, the first set of interconnects 254 is configured to provide a first electrical path for a ground reference signal. For example, the first set of interconnects 254 may be configured to provide a first electrical path along at least a lateral direction and/or vertical direction. In some implementations, the second set of interconnects 256 is configured to provide a second electrical path for a power signal or input/output signal. For example, the second set of interconnects 256 may be configured to provide a second electrical path along at least a vertical direction. Examples of electrical paths for signals are further illustrated and described in FIGS. 4 and 7.

In some implementations, the inter package connection 250 is configured such that the first set of interconnects 254 and the second set of interconnects 256 together, operate as an inter package coaxial connection (e.g., discrete inter package coaxial connection). In this configuration, the first set of interconnects 254 is configured to provide a first electrical path for a ground reference signal, and the second set of interconnects 256 is configured to provide a second electrical path for a power signal or input/output signal. In some implementations, a coaxial connection (e.g., discrete coaxial connection) provides a high performance connection with high quality signals. In some implementations, a discrete coaxial connection is when outer interconnect(s) and/or inner interconnect(s) are discrete. A discrete interconnect is a non-contiguous arrangement of interconnect formed by several interconnects. Examples of discrete interconnects are further illustrated and described in at least FIGS. 8-10 below. Moreover, examples of outer and inner interconnects of a coaxial connection are further described in at least FIGS. 6-10. The electrical properties of a coaxial connection are further described below in at least FIG. 5.

Also, in some implementations, the use of a coaxial connection allows for the reduction of interconnects that are configured to provide an electrical path for a ground reference signal. That is, in some implementations, one solder ball (from the set of solder balls 230) may be coupled to the first set of interconnects 254 of the inter package connection 250. Although it should be noted that more than one solder ball (from the set of solder balls 230) can be coupled to the first set of interconnects 254. Any remaining solder ball(s) from the set of solder balls 230 may be used to provide an electrical path for a power signal and/or input/output signal.

The second package substrate 242 includes a third set of pads 244 and a fourth set of pads 246. The second package substrate 242 may include several interconnects (e.g., traces, vias, pads), which are not shown. The second package substrate 242 may include one or more dielectric layers. The second die 240 is coupled to the second package substrate 242 through a third set of solder balls 248. Specifically, the second die 240 is coupled to the third set of pads 244 through the third set of solder balls 248.

As shown in FIG. 2, the first package 202 is coupled to the second package 204 through the inter package connection 250. Specifically, the first package substrate 222 is coupled to the second package substrate 242 through the second set of pads 226, the inter package connection 250, and the fourth set of pads 246. The second set of pads 226 may be located on the substrate 222 or embedded in the first package substrate 222. In some implementations, the first die 220 is electrically coupled to the second die 240 through an electrical path that includes the first package substrate 222 (e.g., interconnects in the first package substrate), the inter package connection 250, and the second package substrate 242 (e.g., interconnects in the second package substrate).

Figure 3:
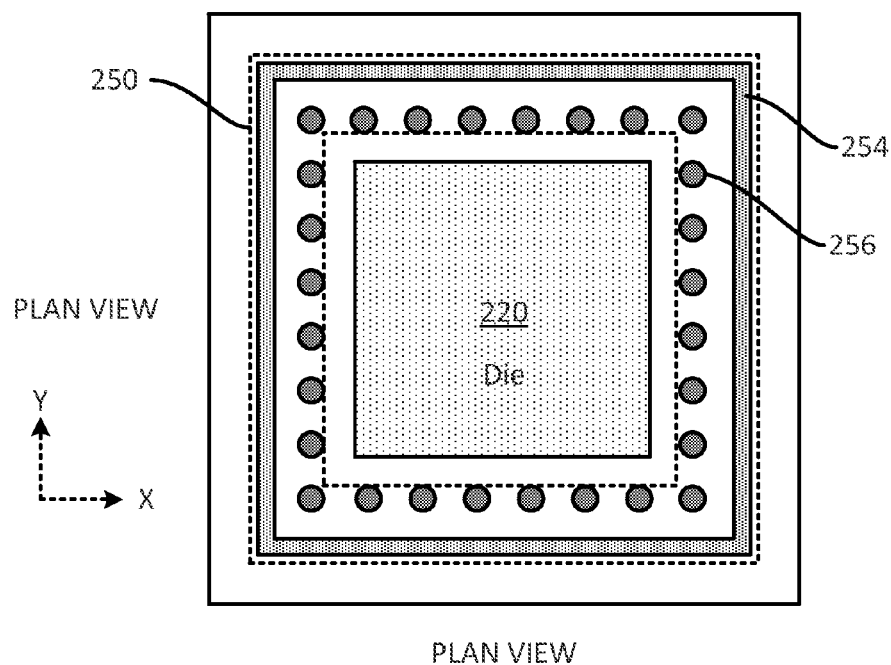
FIG. 3 illustrates a plan view of a package on package (PoP) device that includes an inter package connection.

FIG. 3 illustrates a plan view of a portion of a first integrated device package (e.g., the first package 202). The inter package connection 250 is positioned in the encapsulation layer 260 (shown in FIG. 2) such that it at least partially surrounds (e.g., laterally surrounds) the first die 220 in the first package 202. In some implementations, the first set of interconnects 254 is a solid piece of electrically conductive material (e.g., metal slab) that at least partially surrounds the first die 220. In some implementations, the second set of interconnects 256 includes several vias (e.g., through encapsulation vias) that at least partially surrounds the first die 220. The second set of interconnects 256 is located between the first set of interconnects 254 and the first die 220. In some implementations, the first set of interconnects 254 is configured to provide a first electrical path for a ground reference signal. For example, the first set of interconnects 254 may be configured to provide a first electrical path along at least a lateral direction and/or a vertical direction. In some implementations, the second set of interconnects 256 is configured to provide a second electrical path for a power signal or input/output signal. For example, the second set of interconnects 256 may be configured to provide a second electrical path along at least a vertical direction. Examples of electrical paths for signals are further illustrated and described in FIGS. 4 and 7.

As shown in FIG. 3, the second set of interconnects 256 are vias that have the shape of a cylinder. However, different implementations may have interconnects from the second set of interconnects 256 that have different shapes (e.g., cubes, square, rectangle, oval). FIG. 3 illustrates that the second set of interconnects 256 includes one row of vias and/or one column of vias. However, in some implementations, the second set of interconnects 256 includes one or more rows of vias and/or one or more column of vias. A row of interconnects may include interconnects that are substantially aligned in a row. A column of interconnects may include interconnects that are substantially aligned in a column. Thus, interconnects do not need to be perfectly aligned to be considered in a row of interconnects or a column of interconnects. In some implementations, the second set of interconnects 256 has L/S values of about 100 microns (μm)/70 microns (μm) or less, where L represents width (e.g., line width, trace width, via width), and S represents spacing. In some implementations, the width or diameter of one or more interconnect from the second set of interconnects 256 is about 100 microns (μm) or less, and the spacing between neighboring interconnects from the second set of interconnects is about 70 microns (μm) or less. In some implementations, the spacing between the second set of interconnects 256 and the first set of interconnects 254 is less than the spacing between interconnects from the second set of interconnects 256. In some implementations, the first set of interconnects 254 may have a width of about 70 microns (μm) or less. Other interconnects in the encapsulation layer may also have a width of about 70 microns (μm) or less.

As shown in FIG. 3, the first set of interconnects 254 and the second set of interconnects 256 are positioned at least along a substantial portion of a first side of the die 220 (e.g., 80 percent of length of the first die 220). For example, the first set of interconnects 254 and the second set of interconnects 256 are positioned around the die 220 (e.g., around a first side, a second side, a third side, and a fourth side of the die 220). FIG. 3 illustrates that the first set of interconnects 254 (which may include one or more interconnects) is substantially parallel to the interconnects from the second set of interconnects 256, and vice versa. For example, the first set of interconnects 254 is substantially parallel to an adjacent row or adjacent column of interconnects from the second set of interconnects 256. In some implementations, the first set of interconnects 254 and/or the second set of interconnects 256 may be parallel or perpendicular to a side surface of the die 220.

In some implementations, the first set of interconnects 254 is a discrete interconnect that includes several interconnects. The length of a discrete interconnect may be the cumulative length of all the interconnects that define the discrete interconnect. In some implementations, the length of the discrete interconnect may include any space between interconnects that define the discrete interconnect.

In some implementations, the inter package connection 250 is configured as an inter package coaxial connection (e.g., inter package discrete coaxial connection), where the first set of interconnects 254 is configured to provide a first electrical path for a ground reference signal, and the second set of interconnects 256 is configured to provide a second electrical path for a power signal or input/output signal. In some implementations, a coaxial connection provides a high performance connection with high quality signals. In some implementations, the second set of interconnects 256 may be configured to provide several electrical paths (e.g., second electrical path, third electrical path, fourth electrical path) for several different respective signals (e.g., second signal, third signal, fourth signal). The different respective signals may be power signals and/or input/output signals. The electrical properties of a coaxial connection are further described below in at least FIG. 5.

Figure 4:
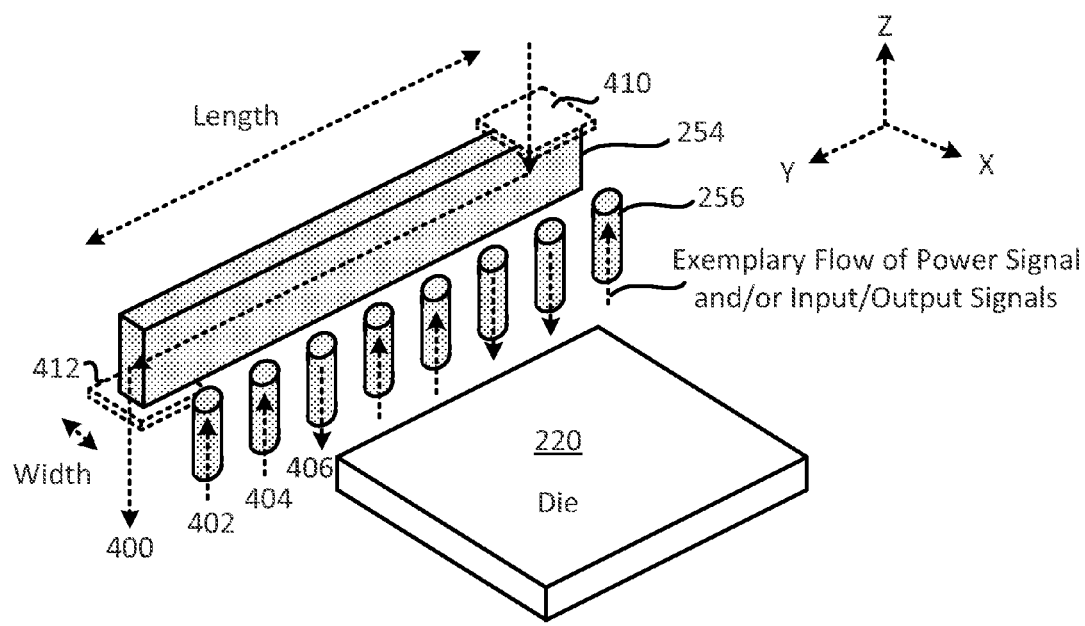
FIG. 4 illustrates an angled view of a package on package (PoP) device that includes an inter package connection.

FIG. 4 illustrates an angled view of a portion of the first package 202. As shown in FIG. 4, the first set of interconnects 254 is a solid piece of electrically conductive material (e.g., metal slab) that at least partially surrounds (e.g., laterally surrounds) the first die 220. The second set of interconnects 256 includes several vias (e.g., through encapsulation vias) that at least partially surrounds the first die 220. The second set of interconnects 256 is located between the first set of interconnects 254 and the first die 220. In some implementations, the first set of interconnects 254 is configured to provide a first electrical path for a ground reference signal. In some implementations, the second set of interconnects 256 is configured to provide a second electrical path for a power signal or input/output signal. As shown in FIG. 4, the second set of interconnects 256 are vias that have the shape of a cylinder. However, different implementations may have interconnects from the second set of interconnects 256 that have different shapes (e.g., cubes, square, rectangle, oval). It is noted that for purpose of clarity, FIG. 4 does not illustrate a dielectric layer and/or an encapsulation layer that may exist between the interconnects and/or the die 220.

FIG. 4 also illustrates exemplary flows of signals that may traverse the interconnects of an inter package connection. It is noted that the flows of the signals shown in FIG. 4 are merely an example, and different implementations may be configured with signals traversing the interconnects differently (e.g., reverse polarity).

FIG. 4 illustrates a reference ground signal 400 traversing from a pad 410, through the interconnect 254, and through the pad 412. The pad 410 may be a pad in a substrate of a second package (e.g., package 204). The pad 412 may be a pad in a substrate of a first package (e.g., first package 202). The pad 412 is laterally offset from the pad 410. In this example, the reference ground signal 400 vertically travels (e.g., travels along a vertical direction) from the pad 410 to the interconnect 254. The reference ground signal 400 then laterally travels (e.g., travels along a lateral direction) through the interconnect 254. The reference ground signal 400 further vertically travels (e.g., travels along a vertical direction) to the pad 412. It is noted that the interconnect 254 may be coupled to more than two pads. The reference ground signal 400 may traverse into the interconnect 254 from more than one pad, and may traverse out of the interconnect 254 from more than one pad. In addition, the direction of the reference ground signal 400 may be reversed.

FIG. 4 further illustrates several signals (e.g., a first signal 402, a second signal 404 and a third signal 406) traversing through the second set of interconnects 256. Each interconnect from the second set of interconnects 256 is coupled to a respective first pad (e.g., top pad), and a respective second pad (e.g., bottom pad). For purpose of clarity the respective pads of the second set of interconnects 256 are not shown. FIG. 4 illustrates that the signals (e.g., a first signal 402, a second signal 404 and a third signal 406) vertically traverse (e.g., travels along a vertical direction) the interconnects from the set of interconnects. Different signals may travel up or down. The signals may include one of at least a power signal and/or an input/output signal.

FIG. 4 illustrates that the first set of interconnects 254 (which may include one or more interconnects) is substantially parallel to the interconnects from the second set of interconnects 256, and vice versa. For example, the first set of interconnects 254 is substantially parallel to an adjacent row or adjacent column of interconnects from the second set of interconnects 256.

In some implementations, the first set of interconnects 254 is a discrete interconnect that includes several interconnects. The length of a discrete interconnect may be the cumulative length of all the interconnects that define the discrete interconnect. In some implementations, the length of the discrete interconnect may include any space between interconnects that define the discrete interconnect.

In some implementations, the length of an interconnect or discrete interconnect from the first set of interconnects 254 is at least about twice as long as a width of the interconnect or discrete interconnect. The length of an interconnect may be along the Y-direction or along the X-direction.

Figure 5:
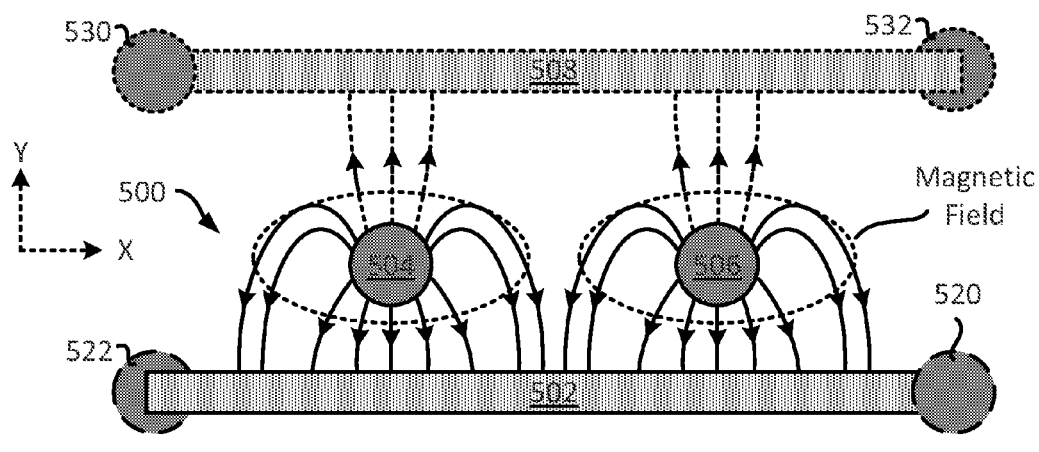
FIG. 5 illustrates electrical properties of an inter package connection.

FIG. 5 conceptually illustrates the electrical properties of a coaxial connection that provide high performance signal connections. The electrical properties described in FIG. 5 may be applied to any of the inter package connections (e.g., inter package connections 250, 600, 800, 900, 1000, 1150, 1250) described in the present disclosure. FIG. 5 illustrates portions of an inter package connection 500. The inter package connection 500 includes a first interconnect 502 (e.g., via), a second interconnect 504 (e.g., first via), and a third interconnect 506 (e.g., second via). Optionally, the inter package connection 500 may include a fourth interconnect 508 (e.g., via). The first interconnect 502 is configured to provide a first electrical path for a ground reference signal. The second interconnect 504 is configured to provide a second electrical path for a second signal (e.g., power signal, input/output signal). The third interconnect 506 is configured to provide a third electrical path for a third signal (e.g., power signal, input/output signal). The second signal may be different or the same as the third signal.

As shown in FIG. 5, the presence of the first interconnect 502 near the second interconnect 504 and third interconnect 506 helps improve the isolation and insertion loss between the second interconnect 504 and the third interconnect 506. As shown, the electric and magnetic fields between conductors are tightly coupled and confined, leading to improved signal delivery characteristics in the second and third interconnects 504 and 506. As shown in FIG. 5, the second signal that traverses through the second interconnect 504 does not interfere (or minimally interferes) with the third signal that traverses the third interconnect 506. Similarly, the third signal that traverses the third interconnect 506 does not interfere (or minimally interferes) with the second signal that traverses the second interconnect 504. Since the second signal and third signals do not interfere or mix with other, the integrity and quality of each respective signal (e.g., second signal, third signal) is preserved, resulting in improved signal performance in the integrated device. Without the presence of the first interconnect 502, the respective signals that traverse the second interconnect 504 and the third interconnect 506 would substantially interfere with each other resulting in low quality signals in the second interconnect 504 and the third interconnect 506. Thus, the first interconnects helps isolate (e.g., helps at least partially isolate) the second signal traversing in the second interconnect 504 from the third signal traversing in the third interconnect 506, and vice-versa.

In some implementations, in order to achieve the above described signal isolation, the second interconnect 504 and the third interconnect 506 have to be near enough the first interconnect 502. In some implementations, a first spacing between the first interconnect 502 and the second interconnect 504 is less than a second spacing between the second interconnect 504 and the third interconnect 506. Similarly, in some implementations, a third spacing between the first interconnect 502 and the third interconnect 506 is less than the second spacing between the second interconnect 504 and the third interconnect 506. Thus, in some implementations, the second interconnect 504 may have to be closer to the first interconnect 502 than the third interconnect 506 in order to get the desired signal isolation as described above. Similarly, the third interconnect 506 may have to be closer to the first interconnect 502 than the second interconnect 504 in order to get the desired signal isolation as described above. Examples of various interconnect spacings were described above in FIG. 3.

To further improve the signal isolation of the signals in the second interconnect 504 and the third interconnect 506, an optional fourth interconnect 508 may be positioned near the second interconnect 504 and the third interconnect 506. The fourth interconnect 508 may be positioned such that the second interconnect 504 and the third interconnect 506 is located between the fourth interconnect 508 and the first interconnect 502. The fourth interconnect 508 is configured to provide a fourth electrical path for a fourth signal. In some implementations, the fourth signal is a reference ground signal similar or identical to the first signal that traverses the first interconnect 502. In some implementations, the fourth interconnect 508 may provide the same or similar functionality as the first interconnect 502. The fourth interconnect 508 may be a discrete interconnect comprising several interconnects.

In some implementations, the second interconnect 504 may have to be closer to the fourth interconnect 508 than the third interconnect 506 in order to get the desired signal isolation as described above. Similarly, the third interconnect 506 may have to be closer to the fourth interconnect 508 than the second interconnect 504 in order to get the desired signal isolation as described above.

FIG. 5 shows that even though the second interconnect 504 is not directly touching the first interconnect 502, there is at least partial electrical coupling (as indicated by the arrows) between the second interconnect 504 and the first interconnect 502 when a signal (e.g., second signal) traverses the second interconnect 504. Similarly, even though the third interconnect 506 is not directly touching the first interconnect 502, there is at least partial electrical coupling (as indicated by the arrows) between the third interconnect 506 and the first interconnect 502 when a signal (e.g., third signal) traverses the third interconnect 506. Thus, in some implementations, the second interconnect 504 is at least partially electrically coupled to the first interconnect 502 (e.g., by an electric field) when a signal (e.g. second signal) traverses the second interconnect 504, even though the second interconnect 504 is free of direct contact with the first interconnect 502. Similarly, in some implementations, the third interconnect 506 is at least partially electrically coupled to the first interconnect 502 (e.g., by an electric field) when a signal (e.g., third signal) traverses the third interconnect 506, even though the third interconnect 506 is free of direct contact with the first interconnect 502. In cases where there is a fourth interconnect 508 configured to provide an electrical path for a fourth signal (e.g., ground reference signal), where the fourth interconnect 508 is configured to operate like the first interconnect 502, the same principle would apply to the fourth interconnect 508 (e.g., at least partial electrical coupling when a signal (e.g. second signal) traverses the second interconnect 504 or the third interconnect 506 even though there is no direct contact with the second interconnect 504 or the third interconnect 506).

FIG. 5 illustrates that the first interconnect 502 is a single contiguous piece of interconnect. However, in some implementations, the first interconnect 502 may be a discrete interconnect defined by several pieces of interconnects. The discrete interconnect may, for example, include a first discrete interconnect and a second discrete interconnect that together perform the same functionality as the contiguous first interconnect 502 shown in FIG. 5. Both the first discrete interconnect and the second discrete interconnect may be configured to provide an electrical path for the first signal (e.g., same first signal, same reference ground signal). In some implementations, a single contiguous piece of interconnect configured to provide an electrical path for a reference ground signal (e.g., interconnects 502, 508) may be at least partially electrically coupled with one or more interconnects configured to provide one or more electrical paths for power signals and/or input/output signals. In FIG. 5, the interconnect 502 is at least partially electrically coupled with two interconnects (e.g., interconnects 504, 506). In FIG. 4, the interconnect 254 is at least partially electrically coupled with 8 interconnects from the set of interconnects 256 (e.g., by an electric field).

FIG. 5 illustrates the first interconnect 502 coupled to a first pad 520 and a second pad 522. The first pad 520 may be a pad in a substrate of a second package (e.g., package 204). The second pad 522 may be a pad in a substrate of a first package (e.g., package 202). The second pad 522 is laterally offset from the first pad 520. In some implementations, a reference ground signal may traverse from the first pad 520, through the first interconnect 502, and through the second pad 522. In this example, the reference ground signal may vertically travel (e.g., travel along a vertical direction) from the first pad 520 to the first interconnect 502. The reference ground signal then laterally travels (e.g., travels along a lateral direction) through the first interconnect 502. The reference ground signal further vertically travels (e.g., travels along a vertical direction) to the second pad 522. It is noted that the first interconnect 502 may be coupled to more than two pads.

FIG. 5 illustrates the optional fourth interconnect 508 coupled to an optional first pad 530 and an optional second pad 532. The first pad 530 may be a pad in a substrate of a second package (e.g., package 204). The second pad 532 may be a pad in a substrate of a first package (e.g., package 202). The second pad 532 is laterally offset from the first pad 530. In some implementations, a reference ground signal may traverse from the first pad 530, through the fourth interconnect 508, and through the second pad 532. In this example, the reference ground signal may vertically travel (e.g., travel along a vertical direction) from the first pad 520 to the fourth interconnect 508. The reference ground signal then laterally travels (e.g., travels along a lateral direction) through the fourth interconnect 508. The reference ground signal further vertically travels (e.g., travels along a vertical direction) to the second pad 532. It is noted that the fourth interconnect 508 may be coupled to more than two pads.

Figure 6:
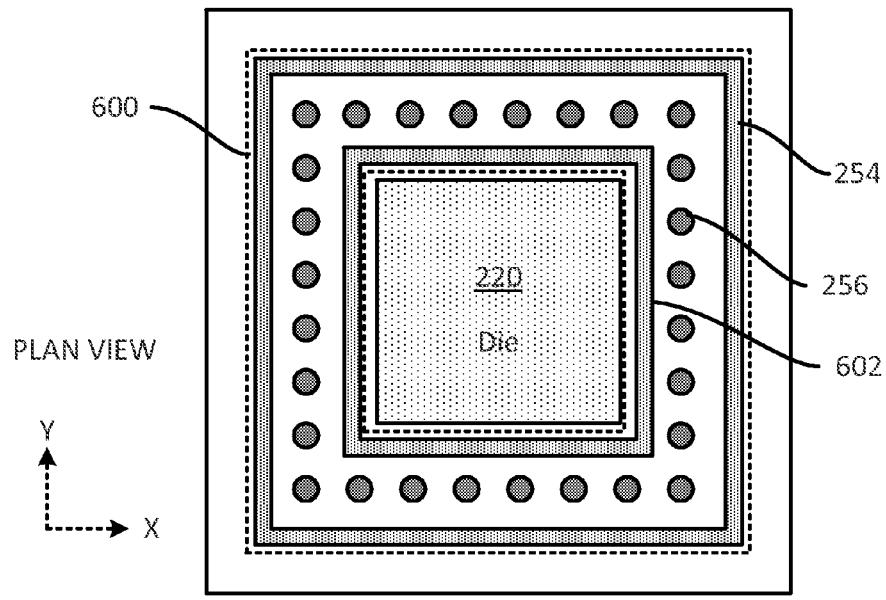
FIG. 6 illustrates a plan view of a package on package (PoP) device that includes an inter package connection.

FIG. 6 illustrates a plan view of a portion of a first integrated device package that includes an inter package connection 600. The inter package connection 600 includes the first set of interconnects 254, the second set of interconnects 256, and a third set of interconnects 602. The first set of interconnects 254 may include one or more first interconnects. The second set of interconnects 256 may include one or more second interconnects. The third set of interconnects 602 may include one or more third interconnects. The inter package connection 600 is positioned in an encapsulation layer (e.g., the encapsulation layer 260 shown in FIG. 2 for example) such that it at least partially surrounds (e.g., laterally surrounds) the first die 220 in a first package. The first set of interconnects 254, the second set of interconnects 256, and the third set of interconnects 602 may vertically traverse the encapsulation layer 260.

In some implementations, the first set of interconnects 254 is a solid piece of electrically conductive material (e.g., metal slab) that at least partially surrounds the first die 220. In some implementations, the second set of interconnects 256 includes several vias (e.g., through encapsulation vias) that at least partially surrounds the first die 220. The second set of interconnects 256 is located between the first set of interconnects 254 and the first die 220. In some implementations, the third set of interconnects 602 is a solid piece of electrically conductive material (e.g., metal slab) that at least partially surrounds the first die 220. The third set of interconnects 602 is located between the second set of interconnects 256 and the first die 220. In some implementations, the inter package connection 600 is an electrical coupling means (e.g., inter package connection means). The electrical coupling means may include a dielectric layer. The electrical coupling means may at least partially surround the die 220. The electrical coupling means may be an inter package coaxial connection means. The electrical coupling means may include an electrical lateral coupling means and an electrical vertical coupling means. In some implementations, the electrical vertical coupling means is configured to provide an electrical path for a signal along a vertical direction. In some implementations, the electrical lateral coupling means is configured to provide an electrical path for a signal along a lateral direction.

In some implementations, the first set of interconnects 254 and the third set of interconnects 602 are configured to provide a first electrical path for a ground reference signal. In some implementations, the second set of interconnects 256 is configured to provide a second electrical path for a power signal or input/output signal. As shown in FIG. 6, the second set of interconnects 256 are vias that have the shape of a cylinder. However, different implementations may have interconnects from the second set of interconnects 256 that have different shapes (e.g., cubes, square, rectangle, oval).

In some implementations, the inter package connection 600 is configured such that the first set of interconnects 254, the second set of interconnects 256, and the third set of interconnects together 602, operate as at least an inter package coaxial connection. In this configuration, the first set of interconnects 254 and the third set of interconnects 602 are configured to provide a first electrical path for a ground reference signal, and the second set of interconnects 256 is configured to provide a second electrical path for a power signal or input/output signal. The inter package coaxial connection is configured such that the first set of interconnects 254 and the third set of interconnects 602 are outer interconnects, and the second set of interconnects 256 is an inner interconnects of the inter package coaxial connection. The first set of interconnects 254 and the third set of interconnects 602 may be a contiguous interconnect. The first set of interconnects 254 and the third set of interconnects 602 (e.g., outer interconnects) surround the second set of interconnects 256 (e.g., inner interconnects). The first set of interconnects 254 and the third set of interconnects 602 may help isolate the second set of interconnects 256 from electric fields or magnetic fields outside of a perimeter defined by the first set of interconnects 254 and the third set of interconnects 602. In some implementations, a coaxial connection provides a high performance connection with high quality signals, as described in FIG. 5, by providing better signal isolation for one or more interconnects from the second set of interconnects 256.

In some implementations, the combination of the first set of interconnects 254 and the third set of interconnects 602 provides an inter package coaxial connection, where the first set of interconnects 254 and the third set of interconnects 602 completely surround several interconnects (some or all) from the second set of interconnects 256. FIG. 6 illustrates that the second set of interconnects 256 includes one row of vias and/or one column of vias. However, in some implementations, the second set of interconnects 256 includes one or more rows of vias and/or one or more column of vias.

As shown in FIG. 6, the first set of interconnects 254, the second set of interconnects 256 and the third set of interconnects 602 are positioned at least along a substantial portion of a first side of the die 220 (e.g., 80 percent of length of the first die 220). For example, the first set of interconnects 254, the second set of interconnects 256, and the third set of interconnects 602 are positioned around the die 220 (e.g., around a first side, a second side, a third side, and a fourth side of the die 220). FIG. 6 illustrates that the first set of interconnects 254 (which may include one or more interconnects) is substantially parallel to the interconnects from the second set of interconnects 256, and vice versa. Similarly, the third set of interconnects 602 (which may include one or more interconnects) is substantially parallel to the interconnects from the second set of interconnects 256, and vice versa. For example, the first set of interconnects 254 and/or the third set of interconnects 602 is substantially parallel to an adjacent row or adjacent column of interconnects from the second set of interconnects 256. In some implementations, the first set of interconnects 254, the second set of interconnects 256 and/or the third set of interconnects 602 may be parallel or perpendicular to a side surface of the die 220.

Figure 8:
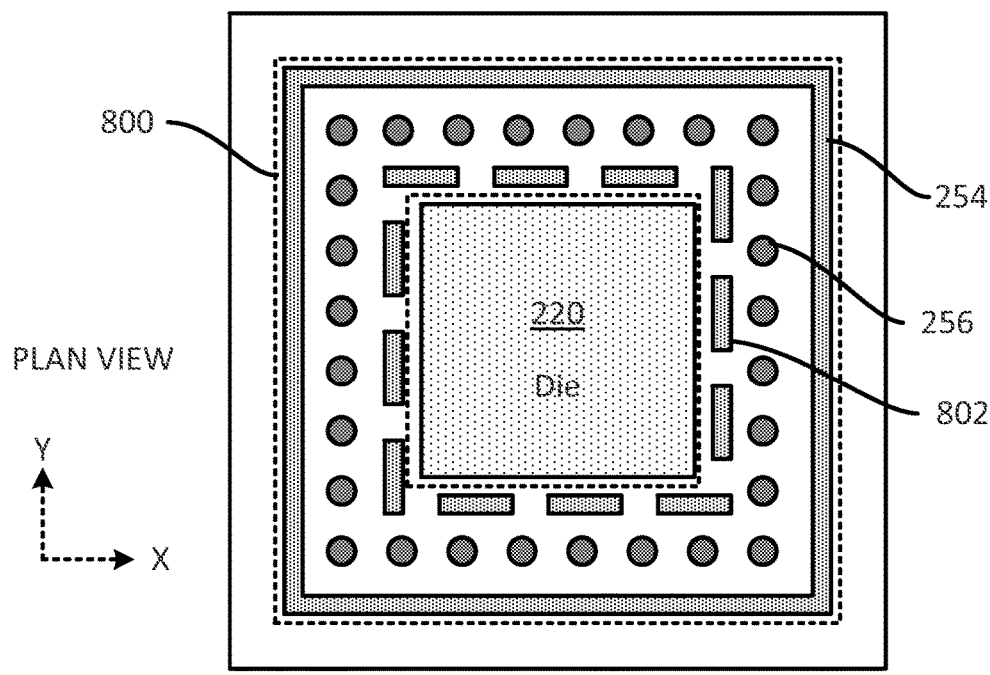
FIG. 8 illustrates a plan view of another package on package (PoP) device that includes an inter package connection.
Figure 9:
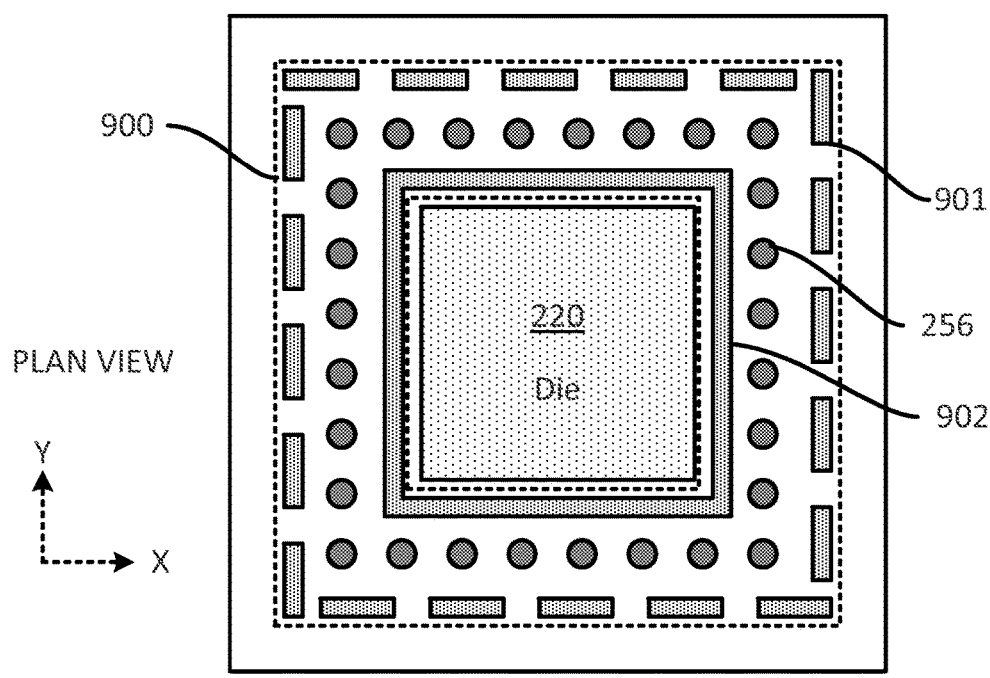
FIG. 9 illustrates a plan view of another package on package (PoP) device that includes an inter package connection.
Figure 10:
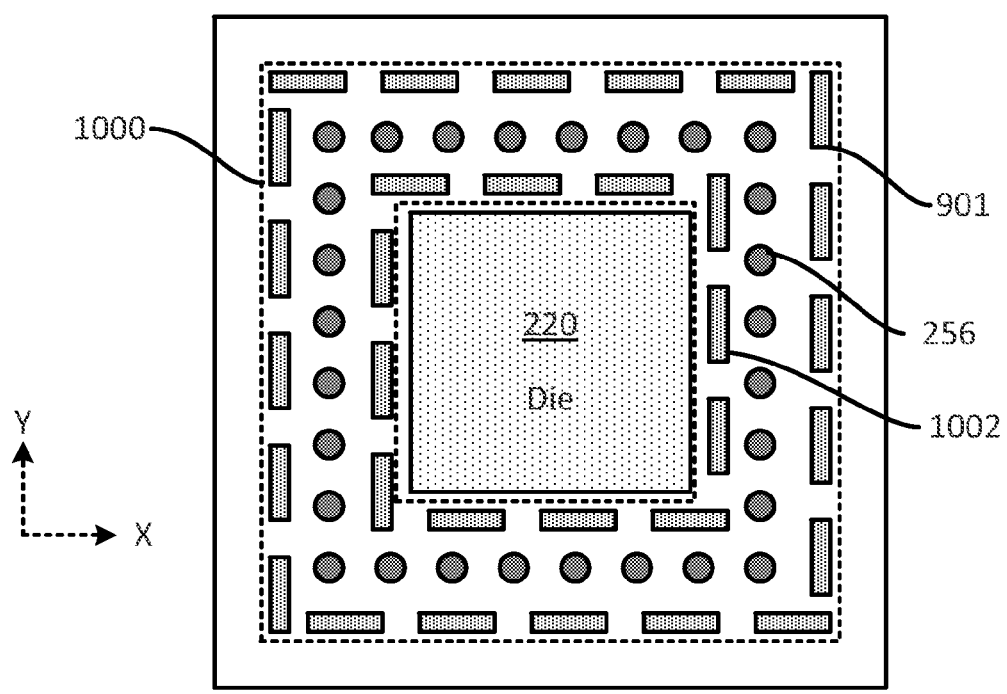
FIG. 10 illustrates a plan view of another package on package (PoP) device that includes an inter package connection.

FIGS. 8-10 illustrate examples of discrete interconnects as discussed previously. The length of a discrete interconnect may be the cumulative length of all the interconnects that define the discrete interconnect. In some implementations, the length of the discrete interconnect may include any space between interconnects that define the discrete interconnect.

In some implementations, the length of an interconnect or discrete interconnect from the first set of interconnects 254 is at least about twice as long as a width of the interconnect or discrete interconnect. Similarly, in some implementations, the length of an interconnect or discrete interconnect from the third set of interconnects 602 is at least about twice as long as a width of the interconnect or discrete interconnect.

Figure 7:
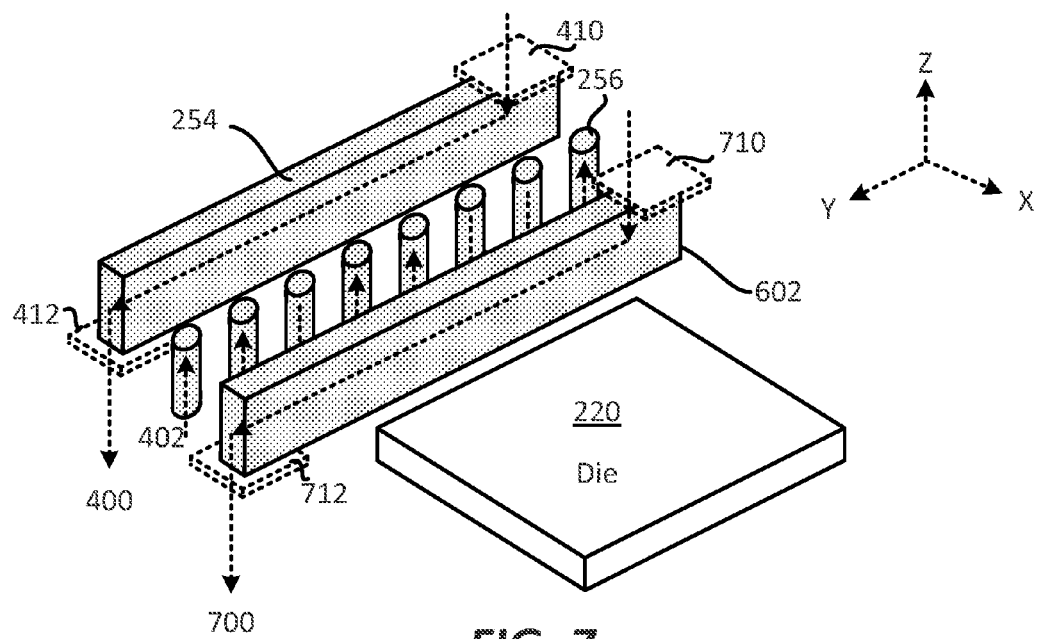
FIG. 7 illustrates an angled view of a package on package (PoP) device that includes an inter package connection.

FIG. 7 illustrates an angled view of a portion of a package that includes an inter package connection (e.g., inter package coaxial connection). As shown in FIG. 7, the third set of interconnects 602 is positioned near the first die 220. The second set of interconnects 256 is positioned near the third set of interconnects, and the first set of interconnects 254 is positioned near the second set of interconnects 256. It is noted that for purpose of clarity, FIG. 7 does not illustrate a dielectric layer and/or an encapsulation layer that may exist between the interconnects and/or the die 220.

FIG. 7 also illustrates exemplary flows of signals that may traverse the interconnects of an inter package connection. It is noted that the flows of the signals shown in FIG. 7 is merely an example, and different implementations may be configured with signals traversing the interconnects differently (e.g., reverse polarity).

FIG. 7 illustrates a reference ground signal 400 traversing from a pad 410, through the interconnect 254, and through the pad 412. The pad 410 may be a pad in a substrate of a second package (e.g., package 204). The pad 412 may be a pad in a substrate of a first package (e.g., package 202). The pad 412 is laterally offset from the pad 410. In this example, the reference ground signal 400 vertically travels (e.g., travels along a vertical direction) from the pad 410 to the interconnect 254. The reference ground signal 400 then laterally travels (e.g., travels along a lateral direction) through the interconnect 254. The reference ground signal 400 further vertically travels (e.g., travels along a vertical direction) to the pad 412. It is noted that the interconnect 254 may be coupled to more than two pads. The reference ground signal 400 may traverse into the interconnect 254 from more than one pad, and may traverse out of the interconnect 254 from more than one pad. In addition, the direction of the reference ground signal 400 may be reversed.

FIG. 7 illustrates a reference ground signal 700 traversing from a pad 710, through the interconnect 602, and through the pad 712. The pad 710 may be a pad in a substrate of a second package substrate (e.g., package substrate 204). The pad 712 may be a pad in a substrate of a first package (e.g., package 202). The pad 712 is laterally offset from the pad 710. In this example, the reference ground signal 700 vertically travels (e.g., travels along a vertical direction) from the pad 710 to the interconnect 602. The reference ground signal 700 then laterally travels (e.g., travels along a lateral direction) through the interconnect 602. The reference ground signal 700 further vertically travels (e.g., travels along a vertical direction) to the pad 712. It is noted that the interconnect 602 may be coupled to more than two pads. The reference ground signal 700 may traverse into the interconnect 602 from more than one pad, and may traverse out of the interconnect 602 from more than one pad. In addition, the direction of the reference ground signal 700 may be reversed. In some implementations, the reference ground signal 700 is the same as the reference ground signal 400.

FIG. 7 further illustrates several signals (e.g., a first signal 402, a second signal 404 and a third signal 406) traversing through the second set of interconnects 256. Each interconnect from the second set of interconnects 256 is coupled to a respective first pad (e.g., top pad), and a respective second pad (e.g., bottom pad). For purpose of clarity the respective pads of the second set of interconnects 256 are not shown. FIG. 4 illustrates that the signals (e.g., a first signal 402, a second signal 404 and a third signal 406) vertically traverse (e.g., travels along a vertical direction) the interconnects from the set of interconnects. Different signals may travel up or down. The signals may include one of at least a power signal and/or a input/output signal.

As shown in FIG. 7, the first set of interconnects 254, the second set of interconnects 256 and the third set of interconnects 602 are positioned at least along a substantial portion of a first side of the die 220 (e.g., 80 percent of length of the first die 220). FIG. 7 illustrates that the first set of interconnects 254 (which may include one or more interconnects) is substantially parallel to the interconnects from the second set of interconnects 256, and vice versa. Similarly, the third set of interconnects 602 (which may include one or more interconnects) is substantially parallel to the interconnects from the second set of interconnects 256, and vice versa. For example, a first surface of the first set of interconnects 254 and/or a first surface of the third set of interconnects 602 is substantially parallel to an adjacent row or adjacent column of interconnects from the second set of interconnects 256.

In some implementations, the first set of interconnects 254 is a discrete interconnect that includes several interconnects. Similarly, the third set of interconnects 602 may be a discrete interconnect that includes several interconnects. The length of a discrete interconnect may be the cumulative length of all the interconnects that define the discrete interconnect. In some implementations, the length of the discrete interconnect may include any space between interconnects that define the discrete interconnect.

In some implementations, the length of an interconnect or discrete interconnect from the first set of interconnects 254 is at least about twice as long as a width of the interconnect or discrete interconnect. Similarly, in some implementations, the length of an interconnect or discrete interconnect from the third set of interconnects 602 is at least about twice as long as a width of the interconnect or discrete interconnect.

Exemplary Inter Package Connections

Different implementations may provide different configuration of an inter package connection. FIGS. 8-10 illustrates other examples of different inter package connections (e.g., inter package coaxial connections) that may be implemented in any of the integrated device packages described in the present disclosure.

FIG. 8 illustrates a plan view of a portion of a first integrated device package that includes an inter package connection 800. The inter package connection includes the first set of interconnects 254, the second set of interconnects 256, and a third set of interconnects 802. The first set of interconnects 254 may include one or more first interconnects. The second set of interconnects 256 may include one or more second interconnects. The third set of interconnects 802 may include one or more third interconnects. As shown in FIG. 8, the inter package connection 800 is positioned in an encapsulation layer (e.g., the encapsulation layer 260) such that it at least partially surrounds (e.g., laterally surrounds) the first die 220 in a first package. The first set of interconnects 254, the second set of interconnects 256, and the third set of interconnects 802 may vertically traverse the encapsulation layer 260.

In some implementations, the first set of interconnects 254 is a solid piece of electrically conductive material (e.g., metal slab) that at least partially surrounds the first die 220. In some implementations, the second set of interconnects 256 includes several vias (e.g., through encapsulation vias) that at least partially surrounds the first die 220. The second set of interconnects 256 is located between the first set of interconnects 254 and the first die 220. In some implementations, the third set of interconnects 802 includes several pieces of electrically conductive material (e.g., metal slabs) that at least partially surrounds the first die 220. The pieces of electrically conductive materials may be uniform or non-uniform. Similarly, the pieces of electrically conductive materials may be uniformly spaced or non-uniformly spaced. The third set of interconnects 802 is located between the second set of interconnects 256 and the first die 220. In some implementations, the inter package connection 800 is an inter package connection means (e.g., an electrical coupling device). The electrical coupling means may include a dielectric layer. The electrical coupling means may at least partially surround the die 220. The electrical coupling means may be an inter package coaxial connection means. The electrical coupling means may include an electrical lateral coupling means and an electrical vertical coupling means. In some implementations, the electrical vertical coupling means is configured to provide an electrical path for a signal along a vertical direction. In some implementations, the electrical lateral coupling means is configured to provide an electrical path for a signal along a lateral direction.

In some implementations, the first set of interconnects 254 and the third set of interconnects 802 are configured to provide a first electrical path for a ground reference signal. In some implementations, the second set of interconnects 256 is configured to provide a second electrical path for a power signal or input/output signal.

In some implementations, the inter package connection 800 is configured such that the first set of interconnects 254, the second set of interconnects 256, and the third set of interconnects 802 together, operate as at least an inter package coaxial connection (e.g., inter package discrete coaxial connection). In this configuration, the first set of interconnects 254 and the third set of interconnects 802 are configured to provide a first electrical path for a ground reference signal, and the second set of interconnects 256 is configured to provide a second electrical path for a power signal or input/output signal. The inter package coaxial connection is configured such that the first set of interconnects 254 and the third set of interconnects 802 are outer interconnects, and the second set of interconnects 256 is an inner interconnects of the inter package coaxial connection. The first set of interconnects 254 may be a contiguous interconnect and the third set of interconnects 802 may be a discrete interconnect that includes several interconnects. In some implementations, the third set of interconnects 802 may be configured to operate and/or have the same functionality as the third set of interconnects 602 of FIG. 6. The first set of interconnects 254 and the third set of interconnects 802 (e.g., outer interconnects) surround the second set of interconnects 256 (e.g., inner interconnects). The first set of interconnects 254 and the third set of interconnects 802 may help isolate the second set of interconnects 256 from electric fields or magnetic fields outside of a perimeter defined by the first set of interconnects 254 and the third set of interconnects 802. In some implementations, a coaxial connection provides a high performance connection with high quality signals, as described in FIG. 5, by providing better signal isolation for one or more interconnects from the second set of interconnects 256.

In some implementations, the combination of the first set of interconnects 254 and the third set of interconnects 802 provides an inter package multi interconnect coaxial connection, where the first set of interconnects 254 and the third set of interconnects 802 surround several interconnects (some or all) from the second set of interconnects 256. FIG. 8 illustrates that the second set of interconnects 256 includes one row of vias and/or one column of vias. However, in some implementations, the second set of interconnects 256 includes one or more rows of vias and/or one or more column of vias. In some implementations, one or more of the single piece of contiguous interconnects from the set of interconnects 802 may be coupled to pads from substrates in manner as described in FIGS. 5 and/or 7 for the interconnect 254 and/or the interconnect 602.

FIG. 9 illustrates a plan view of a portion of a first integrated device package that includes an inter package connection 900. The inter package connection 900 includes the first set of interconnects 901, the second set of interconnects 256, and a third set of interconnects 902. The first set of interconnects 254 may include one or more first interconnects. The second set of interconnects 256 may include one or more second interconnects. The third set of interconnects 902 may include one or more third interconnects. As shown in FIG. 9, the inter package connection 900 is positioned in an encapsulation layer (e.g., the encapsulation layer 260) such that at least partially surrounds (e.g., completely laterally surrounds) the first die 220 in a first package. The first set of interconnects 901, the second set of interconnects 256, and the third set of interconnects 902 may vertically traverse the encapsulation layer 260.

In some implementations, the first set of interconnects 901 is a discrete interconnect that includes several pieces of electrically conductive material (e.g., metal slab) that at least partially surrounds the first die 220. The pieces of electrically conductive materials may be uniform or non-uniform. Similarly, the pieces of electrically conductive materials may be uniformly spaced or non-uniformly spaced. In some implementations, the second set of interconnects 256 includes several vias (e.g., through encapsulation vias) that at least partially surrounds the first die 220. The second set of interconnects 256 is located between the first set of interconnects 901 and the first die 220. In some implementations, the third set of interconnects 902 is a solid piece of electrically conductive material (e.g., metal slab) that at least partially surrounds the first die 220. The third set of interconnects 902 is located between the second set of interconnects 256 and the first die 220. In some implementations, the inter package connection 900 is an electrical coupling means (e.g., inter package connection means). The electrical coupling means may include a dielectric layer. The electrical coupling means may at least partially surround the die 220. The electrical coupling means may be an inter package coaxial connection means.

In some implementations, the first set of interconnects 901 and the third set of interconnects 902 are configured to provide a first electrical path for a ground reference signal. In some implementations, the second set of interconnects 256 is configured to provide a second electrical path for a power signal or input/output signal.

In some implementations, the inter package connection 900 is configured such that the first set of interconnects 901, the second set of interconnects 256, and the third set of interconnects 902 together, operate as at least an inter package coaxial connection (e.g., inter package discrete coaxial connection). In this configuration, the first set of interconnects 901 and the third set of interconnects 902 are configured to provide a first electrical path for a ground reference signal, and the second set of interconnects 256 is configured to provide a second electrical path for a power signal or input/output signal. The inter package coaxial connection is configured such that the first set of interconnects 901 and the third set of interconnects 902 are outer interconnects, and the second set of interconnects 256 is an inner interconnects of the inter package coaxial connection. The first set of interconnects 901 may be a discrete interconnect that includes several interconnects, and the third set of interconnects 902 may be a contiguous interconnect. In some implementations, the first set of interconnects 901 may be configured to operate and/or have the same functionality as the first set of interconnects 254 of FIG. 8. The first set of interconnects 901 and the third set of interconnects 902 (e.g., outer interconnects) surround the second set of interconnects 256 (e.g., inner interconnects). The first set of interconnects 901 and the third set of interconnects 902 may help isolate the second set of interconnects 256 from electric fields or magnetic fields outside of a perimeter defined by the first set of interconnects 901 and the third set of interconnects 902. In some implementations, a coaxial connection provides a high performance connection with high quality signals, as described in FIG. 5, by providing better signal isolation for one or more interconnects from the second set of interconnects 256.

In some implementations, the combination of the first set of interconnects 901 and the third set of interconnects 902 provides an inter package multi interconnect coaxial connection, where the first set of interconnects 254 and the third set of interconnects 902 completely surround several interconnects (some or all) from the second set of interconnects 256. FIG. 9 illustrates that the second set of interconnects 256 includes one row of vias and/or one column of vias. However, in some implementations, the second set of interconnects 256 includes one or more rows of vias and/or one or more column of vias. In some implementations, one or more of the single piece of contiguous interconnects from the set of interconnects 901 may be coupled to pads from substrates in manner as described in FIGS. 5 and/or 7 for the interconnect 254 and/or the interconnect 602.

FIG. 10 illustrates a plan view of a portion of a first integrated device package that includes an inter package connection 1000. The inter package connection includes the first set of interconnects 901, the second set of interconnects 256, and a third set of interconnects 1002. The first set of interconnects 901 may include one or more first interconnects. The second set of interconnects 256 may include one or more second interconnects. The third set of interconnects 1002 may include one or more third interconnects. As shown in FIG. 10, the inter package connection 1000 is positioned in an encapsulation layer (e.g., the encapsulation layer 260) such that at least partially surrounds (e.g., completely laterally surrounds) the first die 220 in a first package. The first set of interconnects 901, the second set of interconnects 256, and the third set of interconnects 1002 may vertically traverse the encapsulation layer 260.

In some implementations, the first set of interconnects 901 is a discrete interconnect that includes several pieces of electrically conductive material (e.g., metal slab) that at least partially surrounds the first die 220. The pieces of electrically conductive materials may be uniform or non-uniform. Similarly, the pieces of electrically conductive materials may be uniformly spaced or non-uniformly spaced. In some implementations, the second set of interconnects 256 includes several vias (e.g., through encapsulation vias) that at least partially surrounds the first die 220. The second set of interconnects 256 is located between the first set of interconnects 901 and the first die 220. In some implementations, the third set of interconnects 1002 is a discrete interconnect that includes several pieces of electrically conductive material (e.g., metal slab) that at least partially surrounds the first die 220. The third set of interconnects 1002 is located between the second set of interconnects 256 and the first die 220. In some implementations, the inter package connection 1000 is an electrical coupling means (e.g., inter package connection means). The electrical coupling means may include a dielectric layer. The electrical coupling means may at least partially surround the die 220. The electrical coupling means may be an inter package coaxial connection means.

In some implementations, the first set of interconnects 901 and the third set of interconnects 1002 are configured to provide a first electrical path for a ground reference signal. In some implementations, the second set of interconnects 256 is configured to provide a second electrical path for a power signal or input/output signal.

In some implementations, the inter package connection 1000 is configured such that the first set of interconnects 901, the second set of interconnects 256, and the third set of interconnects 1002 together, operate as at least an inter package coaxial connection (e.g., inter package discrete coaxial connection). In this configuration, the first set of interconnects 901 and the third set of interconnects 1002 are configured to provide a first electrical path for a ground reference signal, and the second set of interconnects 256 is configured to provide a second electrical path for a power signal or input/output signal. The inter package coaxial connection 1000 is configured such that the first set of interconnects 901 and the third set of interconnects 1002 are outer interconnects, and the second set of interconnects 256 is an inner interconnects of the inter package coaxial connection 1000. The first set of interconnects 901 may be a discrete interconnect that includes several interconnects, and the third set of interconnects 902 may be a discrete interconnect that includes several interconnects. In some implementations, the first set of interconnects 901 may be configured to operate and/or have the same functionality as the first set of interconnects 254 of FIG. 8. In some implementations, the third set of interconnects 1002 may be configured to operate and/or have the same functionality as the first set of interconnects 602 of FIG. 6. The first set of interconnects 901 and the third set of interconnects 1002 (e.g., outer interconnects) surround the second set of interconnects 256 (e.g., inner interconnects). The first set of interconnects 901 and the third set of interconnects 1002 may help isolate the second set of interconnects 256 from electric fields or magnetic fields outside of a perimeter defined by the first set of interconnects 901 and the third set of interconnects 1002. In some implementations, a coaxial connection provides a high performance connection with high quality signals, as described in FIG. 5, by providing better signal isolation for one or more interconnects from the second set of interconnects 256.

In some implementations, the combination of the first set of interconnects 901 and the third set of interconnects 1002 provides an inter package multi interconnect coaxial connection, where the first set of interconnects 901 and the third set of interconnects 1002 completely surround several interconnects (some or all) from the second set of interconnects 256. FIG. 10 illustrates that the second set of interconnects 256 includes one row of vias and/or one column of vias. However, in some implementations, the second set of interconnects 256 includes one or more rows of vias and/or one or more column of vias. In some implementations, one or more of the single piece of contiguous interconnects from the set of interconnects 901 may be coupled to pads from substrates in manner as described in FIGS. 5 and/or 7 for the interconnect 254 and/or the interconnect 602. Similarly, in some implementations, one or more of the single piece of contiguous interconnects from the set of interconnects 1002 may be coupled to pads from substrates in manner as described in FIGS. 5 and/or 7 for the interconnect 254 and/or the interconnect 602.

Figure 11:
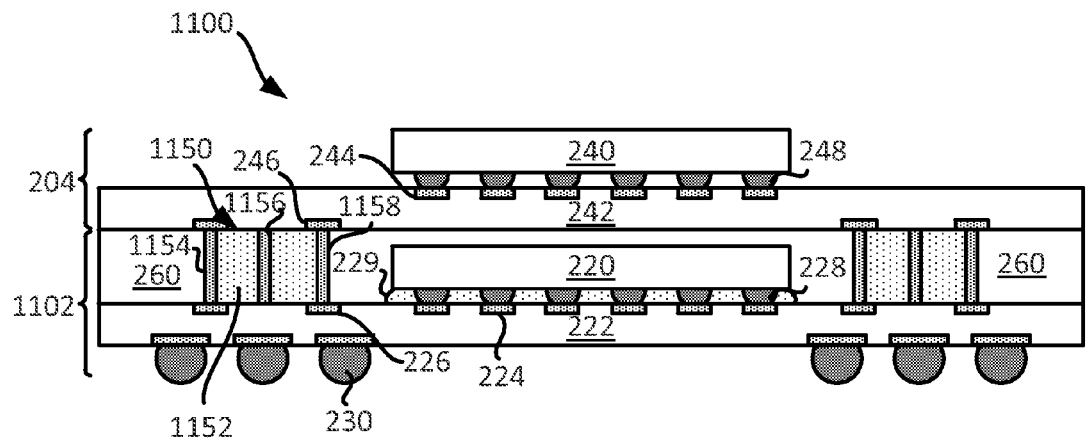
FIG. 11 illustrates a profile view of a package on package (PoP) device that includes an inter package connection.

Exemplary Package on Package (PoP) Device Comprising High Performance Inter Package Connection FIG. 11 illustrates a package on package (PoP) device 1100 that includes a high performance inter package connection. The PoP device 1100 includes a first package 202 (e.g., first integrated device package) and a second package 1104 (e.g., second integrated device package). The first package 202 includes a first die 220, a first package substrate 222, an inter package connection 1150, and an encapsulation layer 260. The second package 204 includes the second die 240 and the second package substrate 242, as described in FIG. 2 above.

The first package substrate 222 includes a first set of pads 224 and a second set of pads 226. The first package substrate 222 may include one or more dielectric layers. The first package substrate 222 may include several interconnects (e.g., traces, vias, pads), which are not shown. The first die 220 is coupled to the first package substrate 222 through a first set of solder balls 228. Specifically, the first die 220 is coupled to the first set of pads 224 through the first set of solder balls 228. An underfill 229 surrounds the first set of solder balls 228. A second set of solder balls 230 is coupled to the first package substrate 222.

The encapsulation layer 260 encapsulates the first die 220. The inter package connection 1150 is at least partially embedded in the encapsulation layer 260. The inter package connection 1150 includes a dielectric layer 1152, a first set of interconnects 1154, a second set of interconnects 1156, and a third set of interconnects 1158. The inter package connection 1150 vertically traverses the encapsulation layer 260. The first set of interconnects 1154 may include one or more first interconnects. The second set of interconnects 1156 may include one or more second interconnects. The third set of interconnects 1158 may include one or more third interconnects. The dielectric layer 1152 may include one of at least a silicon material and/or glass material. In some implementations, the inter package connection 1150 may be any of the inter package connection described in the present disclosure, including inter package connections 800, 900 and/or 1000.

In some implementations, the inter package connection 1150 at least partially surrounds (e.g., completely laterally surrounds) the first die 220. In some implementations, the first set of interconnects 1154 includes one or more pieces of electrically conductive material (e.g., metal slab) that at least partially surrounds the first die 220. In some implementations, the second set of interconnects 1156 includes several vias (e.g., through encapsulation vias) that at least partially surrounds the first die 220. The second set of interconnects 1156 is located between the first set of interconnects 1154 and the first die 220. In some implementations, the third set of interconnects 1158 includes one or more pieces of electrically conductive material (e.g., metal slabs) that at least partially surrounds the first die 220. The third set of interconnects 1158 is located between the second set of interconnects 256 and the first die 220.

In some implementations, the first set of interconnects 1154 and the third set of interconnects 1158 are configured to provide a first electrical path for a ground reference signal. In some implementations, the second set of interconnects 1156 is configured to provide a second electrical path for a power signal or input/output signal.

In some implementations, the inter package connection 1150 is configured as at least an inter package coaxial connection (e.g., inter package discrete coaxial connection), where the first set of interconnects 1154 and the third set of interconnects 1158 are configured to provide a first electrical path for a ground reference signal, and the second set of interconnects 1156 is configured to provide a second electrical path for a power signal or input/output signal. In some implementations, a coaxial connection provides a high performance connection with high quality signals.

As shown in FIG. 11, the first package 1102 is coupled to the second package 204 through the inter package connection 1150. Specifically, the first package substrate 222 is coupled to the second package substrate 242 through the second set of pads 226, the inter package connection 1150, and the fourth set of pads 246. In some implementations, the first die 220 is electrically coupled to the second die 240 through an electrical path that includes the first package substrate 222 (e.g., interconnects in the first package substrate), the inter package connection 1150, and the second package substrate 242 (e.g., interconnects in the second package substrate).

Figure 12:
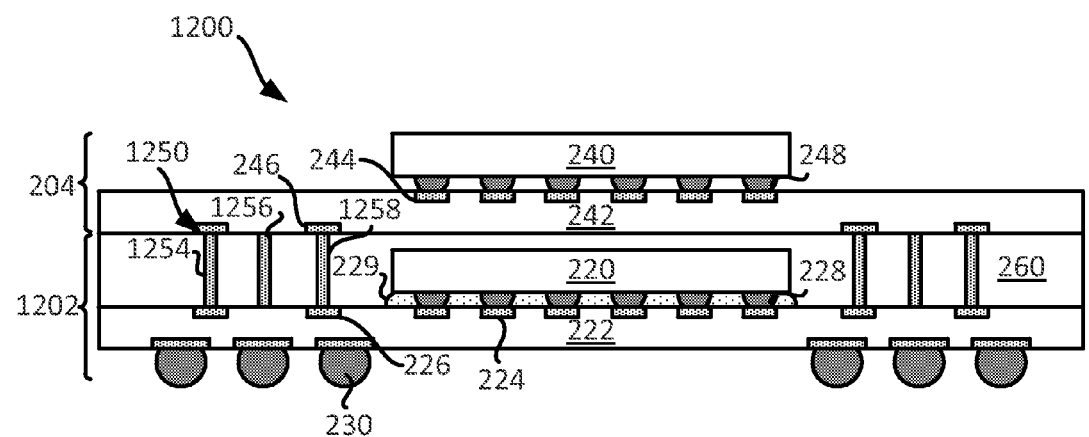
FIG. 12 illustrates a profile view of a package on package (PoP) device that includes an inter package connection.

FIG. 12 illustrates a package on package (PoP) device 1200 that includes a high performance inter package connection. The PoP device 1200 includes a first package 202 (e.g., first integrated device package) and a second package 1204 (e.g., second integrated device package). The first package 202 includes a first die 220, a first package substrate 222, an inter package connection 1250, and an encapsulation layer 260. The second package 204 includes the second die 240 and the second package substrate 242, as described in FIG. 2 above. FIG. 12 is similar to FIG. 11, except that the inter package connection 1250 does not include a dielectric layer (e.g., dielectric layer 1152).

The first package substrate 222 includes a first set of pads 224 and a second set of pads 226. The first package substrate 222 may include one or more dielectric layers. The first package substrate 222 may include several interconnects (e.g., traces, vias, pads), which are not shown. The first die 220 is coupled to the first package substrate 222 through a first set of solder balls 228. Specifically, the first die 220 is coupled to the first set of pads 224 through the first set of solder balls 228. An underfill 229 surrounds the first set of solder balls 228. A second set of solder balls 230 is coupled to the first package substrate 222.

The encapsulation layer 260 encapsulates the first die 220. The inter package connection 1250 is at least partially embedded in the encapsulation layer 260. The inter package connection 1250 a first set of interconnects 1254, a second set of interconnects 1256, and a third set of interconnects 1258. The inter package connection 1250 vertically traverses the encapsulation layer 260. The first set of interconnects 1254 may include one or more first interconnects. The second set of interconnects 1256 may include one or more second interconnects. The third set of interconnects 1258 may include one or more third interconnects. In some implementations, the inter package connection 1250 may be any of the inter package connection described in the present disclosure, including inter package connections 800, 900 and/or 1000.

In some implementations, the inter package connection 1250 at least partially surrounds (e.g., laterally surrounds) the first die 220. In some implementations, the first set of interconnects 1254 includes one or more pieces of electrically conductive material (e.g., metal slab) that at least partially surrounds the first die 220. In some implementations, the second set of interconnects 1256 includes several vias (e.g., through encapsulation vias) that at least partially surrounds the first die 220. The second set of interconnects 1256 is located between the first set of interconnects 1254 and the first die 220. In some implementations, the third set of interconnects 1258 includes one or more pieces of electrically conductive material (e.g., metal slabs) that at least partially surrounds the first die 220. The third set of interconnects 1258 is located between the second set of interconnects 256 and the first die 220.

In some implementations, the first set of interconnects 1254 and the third set of interconnects 1258 are configured to provide a first electrical path for a ground reference signal. In some implementations, the second set of interconnects 1256 is configured to provide a second electrical path for a power signal or input/output signal.

In some implementations, the inter package connection 1250 is configured as at least an inter package coaxial connection (e.g., inter package discrete coaxial connection), where the first set of interconnects 1254 and the third set of interconnects 1258 are configured to provide a first electrical path for a ground reference signal, and the second set of interconnects 1256 is configured to provide a second electrical path for a power signal or input/output signal. In some implementations, a coaxial connection provides a high performance connection with high quality signals.

As shown in FIG. 12, the first package 1202 is coupled to the second package 204 through the inter package connection 1250. Specifically, the first package substrate 222 is coupled to the second package substrate 242 through the second set of pads 226, the inter package connection 1250, and the fourth set of pads 246. In some implementations, the first die 220 is electrically coupled to the second die 240 through an electrical path that includes the first package substrate 222 (e.g., interconnects in the first package substrate), the inter package connection 1250, and the second package substrate 242 (e.g., interconnects in the second package substrate).

Exemplary Sequence for Providing/Fabricating an Inter Package Connection

Figure 13:
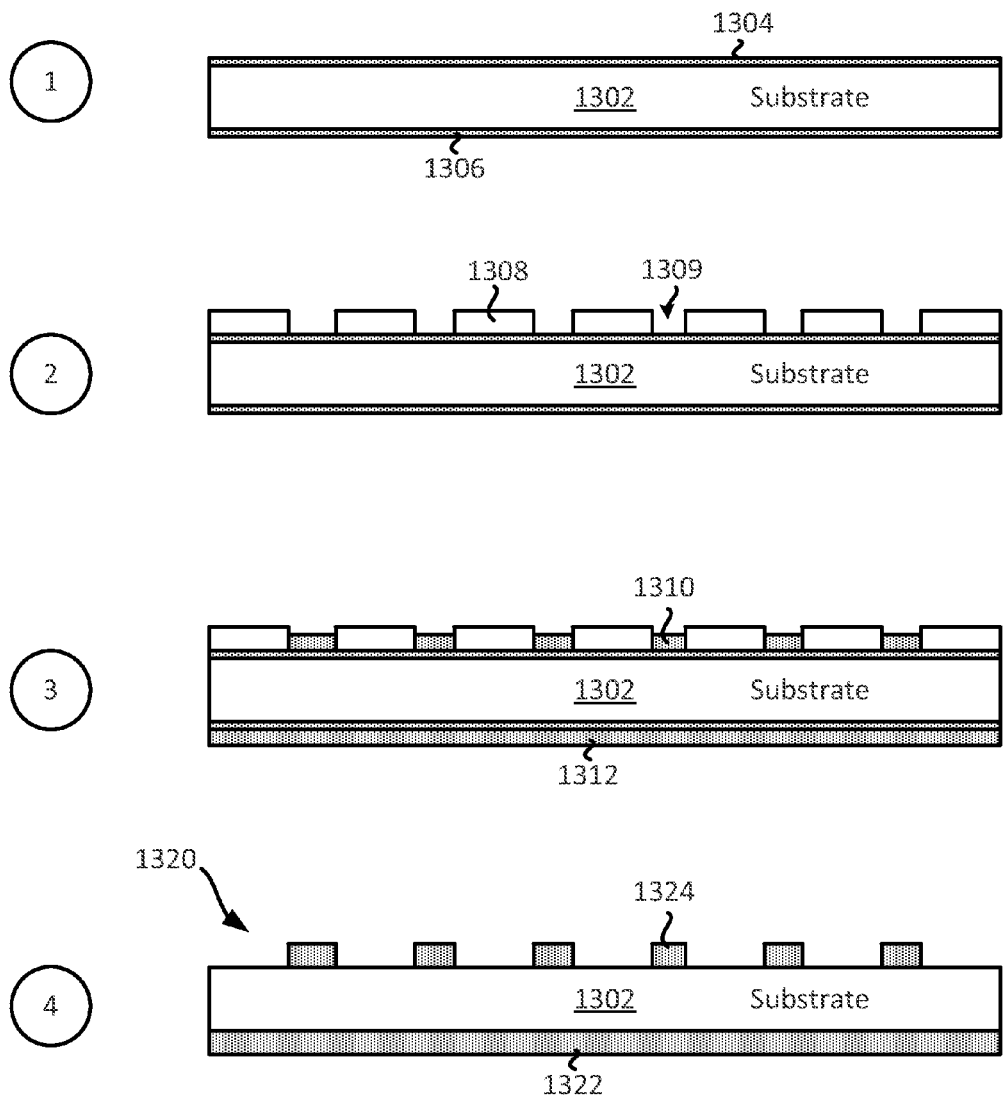
FIG. 13 illustrates an exemplary sequence for providing/fabricating an inter package connection.

In some implementations, providing/fabricating an inter package connection (e.g., inter package coaxial connection) includes several processes. FIG. 13 illustrates an exemplary sequence for providing/fabricating an inter package connection. In some implementations, the sequence of FIG. 13 may be used to provide/fabricate the inter package connection of FIGS. 2-4, 6-12 and/or other inter package connections described in the present disclosure.

It should be noted that the sequence of FIG. 13 may combine one or more stages in order to simplify and/or clarify the sequence for providing/fabricating an inter package connection. In some implementations, the order of the processes may be changed or modified.

Stage 1 illustrates a state after a substrate 1302 that includes a first metal layer 1304 and a second metal layer 1306 is provided. In some implementations, the substrate 1302 is provided by a supplier. In some implementations, the substrate 1302 is fabricated (e.g., formed). In some implementations, the substrate 1302 is one of at least a silicon substrate and/or wafer (e.g., silicon wafer). The first and second metal layers 1304 and 1306 may be seed layers.

Stage 2 illustrates a state after a photo resist layer 1308 is provided (e.g., formed) on the first metal layer 1304. As shown in stage 2, the photo resist layer 1308 is formed such that several cavities (e.g., cavity 1309) are formed.

Stage 3 illustrates a state after a third metal layer 1310 is formed in the cavities of the photo resist layer 1308, and a fourth metal layer 1312 is formed on the second metal layer 1306. In some implementations, a plating process is used to form the third metal layer 1310 and the fourth metal layer 1312.

Stage 4 illustrates a state after the photo resist layer 1308 is removed (e.g., etched out), leaving behind an inter package connection 1320 that includes the substrate 1302, a first set of interconnects 1322, and a second set of interconnects

1324. Portions of the first metal layer 1304 underneath the photo resist layer 1308 are also removed when the photo resist layer 1308 is removed. The first set of interconnects 1322 includes the second metal layer 1306 and the fourth metal layer 1312. The second set of interconnects 1324 includes portions of the first metal layer 1304 and portions of the third metal layer 1310.

Figure 14:
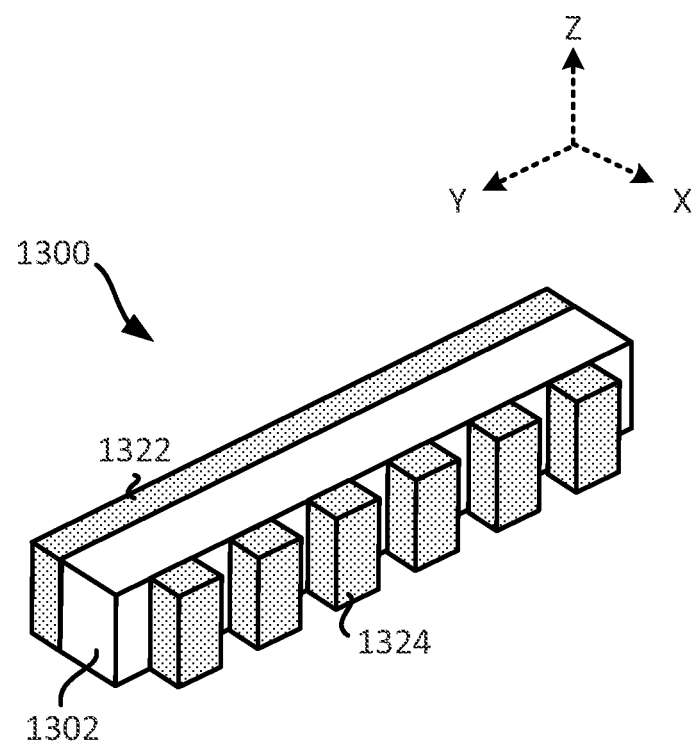
FIG. 14 illustrates an exemplary inter package connection.

FIG. 14 illustrates an angled view of the inter package connection 1320 that may be fabricated using the sequence of FIG. 13. As shown in FIG. 14, the inter package connection 1320 (shown in FIG. 13) includes the substrate 1302, the first set of interconnects 1322, and the second set of interconnects 1324. In some implementations, the inter package connection 1320 is configured as at least an inter package coaxial connection, where the first set of interconnects 1322 is configured to provide a first electrical path for a ground reference signal, and the second set of interconnects 1324 is configured to provide a second electrical path for a power signal or input/output signal.

Figure 15:
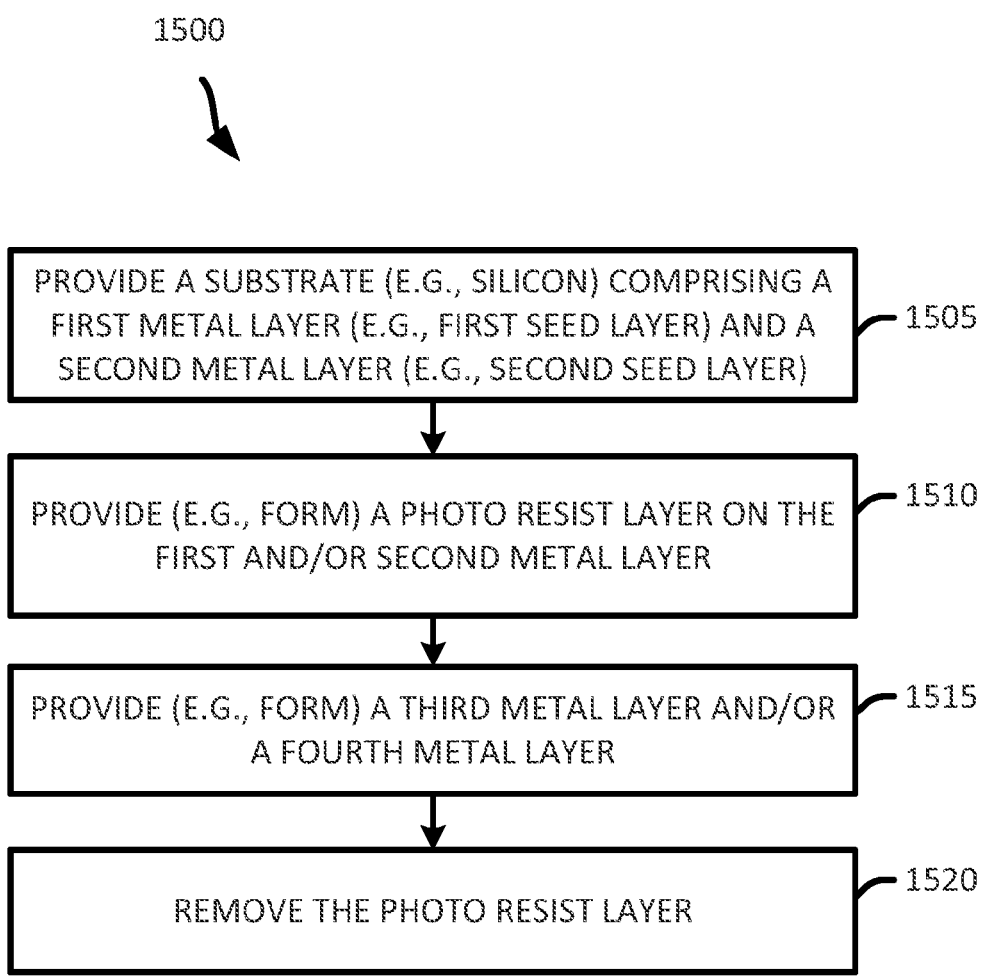
FIG. 15 illustrates an exemplary flow diagram of a method for providing/fabricating an inter package connection.

Exemplary Flow Diagram of a Method for Providing/Fabricating an Inter Package Connection FIG. 15 illustrates an exemplary flow diagram of a method 1500 for providing/fabricating an inter package connection. In some implementations, the method of FIG. 15 may be used to provide/fabricate the inter package connection of FIGS. 2-4, 6-12 and/or other inter package connections.

It should be noted that the flow diagram of FIG. 15 may combine one or more processes in order to simplify and/or clarify the method for providing an inter package connection. In some implementations, the order of the processes may be changed or modified.

The method provides (at 1505) a substrate that includes a first metal layer and a second metal layer (e.g. 1304 and 1306 respectively). In some implementations, the substrate is provided by a supplier. In some implementations, the substrate is fabricated (e.g., formed). In some implementations, the substrate is one of at least a silicon substrate and/or wafer (e.g., silicon wafer). The first and second metal layers may be seed layers.

The method provides (at 1510) a photo resist layer. In some implementations, the photo resist layer is formed on the first metal layer and/or the second metal layer. In some implementations, the photo resist layer is formed such that several cavities are formed in the photo resist layer.

The method provides (at 1515) a third metal layer (e.g. 1310) in the cavities of the photo resist layer, and a fourth metal layer on the second metal layer. In some implementations, a plating process is used to form the third metal layer and the fourth metal layer.

The method removes (at 1520) the photo resist layer. In some implementations, removing the photo resist layer includes etching out the photo resist layer, leaving behind an inter package connection that includes the substrate, a first set of interconnects, and a second set of interconnects. In some implementations, portions of the first metal layer underneath the photo resist layer are also removed when the photo resist layer is removed. The first set of interconnects includes the second metal layer and the fourth metal layer. The second set of interconnects includes portions of the first metal layer and portions of the third metal layer.

Figure 16:
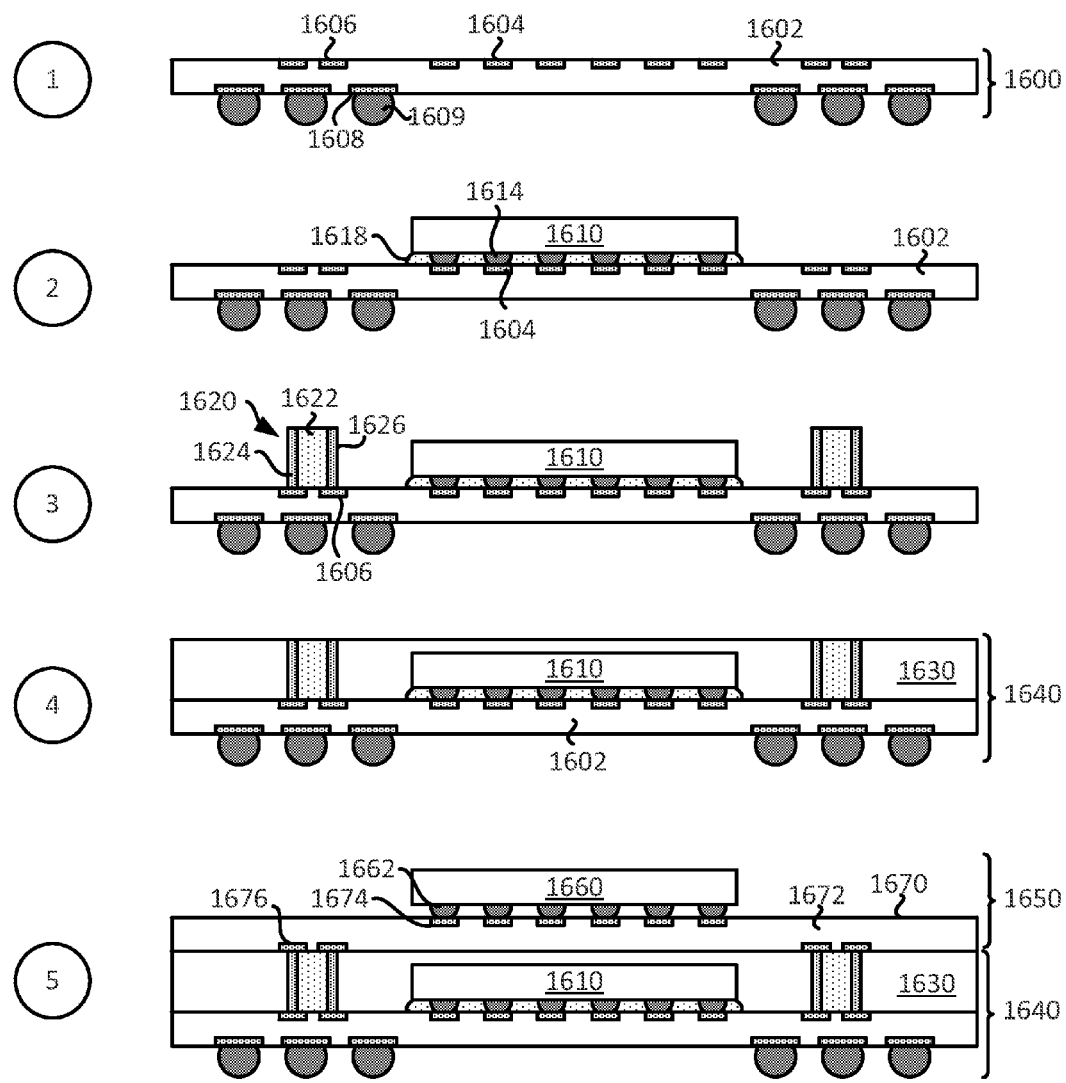
FIG. 16 illustrates an exemplary sequence for providing/fabricating a package on package (PoP) device that includes an inter package connection.

Exemplary Sequence for Providing/Fabricating a Package on Package (PoP) Device that Includes an Inter Package Connection In some implementations, providing/fabricating an package on package (PoP) device that includes an inter package connection includes several processes. FIG. 16 illustrates an exemplary sequence for providing/fabricating a package on package (PoP) device that includes an inter package connection. In some implementations, the sequence of FIG. 16 may be used to provide/fabricate the PoP device of FIGS. 2, 11-12 and/or other PoP devices in the present disclosure such as FIGS. 8-10. However, for the purpose of simplification, FIG. 16 will be described in the context of providing/fabricating the PoP device of FIG. 2.

It should be noted that the sequence of FIG. 16 may combine one or more stages in order to simplify and/or clarify the sequence for providing an integrated device package. In some implementations, the order of the processes may be changed or modified.

Stage 1 illustrates a state after a first package substrate 1600 is provides. The first package substrate 1600 includes a dielectric layer 1602 (which may include several dielectric layers), a first set of pads 1604, a second set of pads 1606, and a third set of pads 1608. The first package substrate 1600 may also include a set of solder balls 1609. The first package substrate 1600 may include several interconnects (e.g., traces, vias, pads), which are not shown.

Stage 2 illustrates a state after a first die 1610 is coupled to the first package substrate 1600. The first die 1610 is coupled to the first package substrate 1600 through a first set of solder balls 1614. Specifically, the first die 1610 is coupled to the first set of pads 1604 through the first set of solder balls 1614. An underfill 1618 surrounds the first set of solder balls 1614.

Stage 3 illustrates a state after at least one inter package connection 1620 is coupled to the first package substrate 1600. In some implementations, the inter package connection 1620 may be similar to the inter package connections 250, 600, 800, 900, 1000, 1150, 1250, and/or 1320. The inter package connection 1620 may be coupled to the first package substrate 1600 by using an attach paste. In some implementations, the inter package connection 1620 is coupled to the first package substrate 1600 such that the inter package connection 1620 at least partially surrounds the first die 1610. It should be noted that in some implementations, the inter package connection 1620 may be coupled to the first package substrate 1600 before the first die 1610 is coupled to the first package substrate 1600.

The inter package connection 1620 includes a dielectric layer 1622, a first set of interconnects 1624, and a second set of interconnects 1626. In some implementations, the first set of interconnects 1624 is one or more pieces of electrically conductive material (e.g., metal slab) that at least partially surrounds the first die 1610. In some implementations, the second set of interconnects 1256 includes several vias (e.g., through encapsulation vias) that at least partially surrounds the first die 1610. The second set of interconnects 1626 is located between the first set of interconnects 1624 and the first die 1610. In some implementations, the first set of interconnects 1624 is configured to provide a first electrical path for a ground reference signal. In some implementations, the second set of interconnects 1626 is configured to provide a second electrical path for a power signal or input/output signal.

Stage 4 illustrates a state after an encapsulation layer 1630 is formed over the first package substrate 1600, the first die 1610, and the inter package connection 1620. The encapsulation layer 1630 may include a mold, an epoxy, and/or a resin fill. In some implementations, portions of the encapsulation layer 1630 may be grinded (e.g., to expose interconnects, pads). In some implementations, stage 4 illustrates a first package 1640 (e.g., first integrated device package)

that includes the first packages substrate 1600, the first die 1610, the inter package connection 1620, and the encapsulation layer 1630.

Stage 5 illustrates a state after a second package 1650 (e.g., second integrated device package) is coupled to the first package 1640 (e.g., first integrated device package). The second package 1650 includes a second die 1660 and a second package substrate 1670. The second package substrate 1670 includes a dielectric layer 1672 (which may include several dielectric layers), a fourth set of pads 1674, and a fifth set of pads 1676. The second package substrate 1670 may include several interconnects (e.g., traces, pads, vias). The second die 1660 is coupled to the second package substrate 1670 through a fourth set of solder balls 1662. Specifically, the second die 1660 is coupled to the fourth set of pads 1674 through the third set of solder balls 1662. The fifth set of pads 1676 is coupled to the inter package connection 1620.

Figure 17:
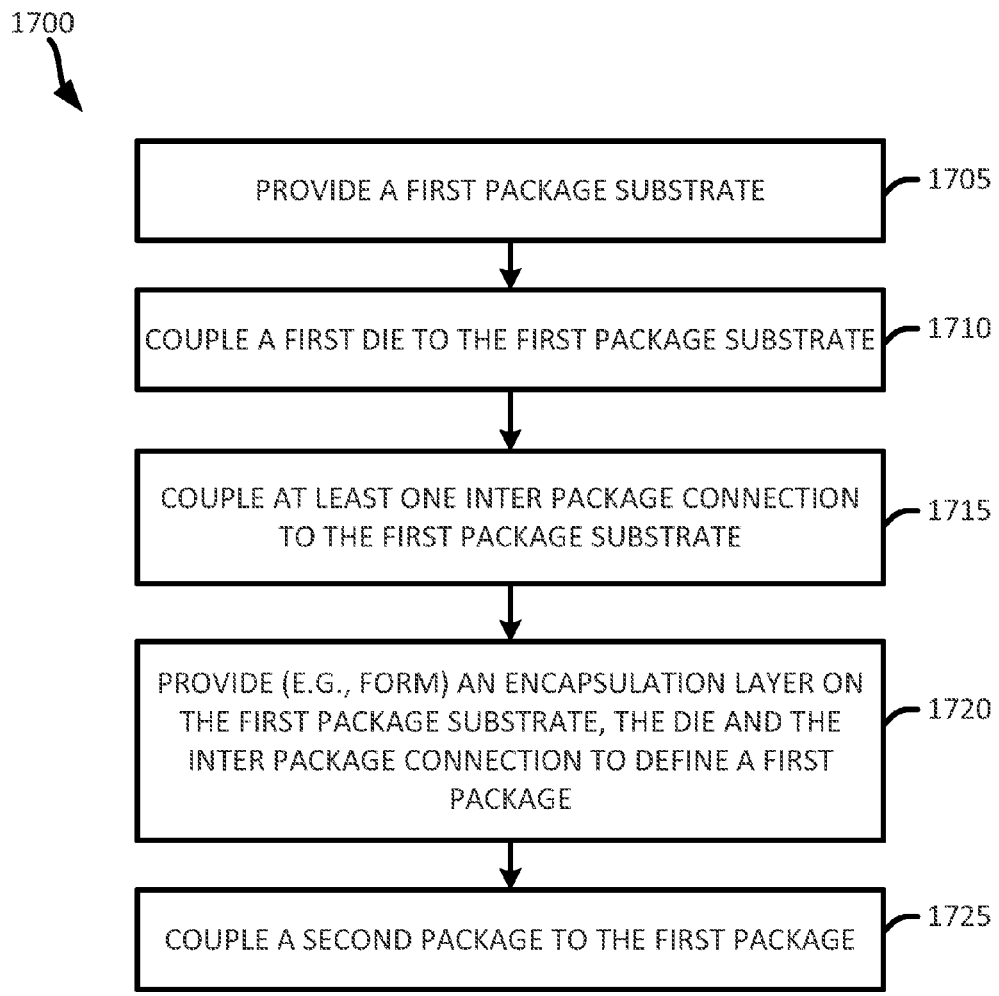
FIG. 17 illustrates an exemplary flow diagram of a method for providing/fabricating a package on package (PoP) device that includes an inter package connection.

Exemplary Method for Providing/Fabricating a Package on Package (PoP) Device that Includes an Inter Package Connection FIG. 17 illustrates an exemplary flow diagram of a method 1700 for providing/fabricating a package on package (PoP) device that includes an inter package connection. In some implementations, the method of FIG. 17 may be used to provide/fabricate the integrated device package of FIG. 2, 10-12 and/or other PoP devices in the present disclosure.

It should be noted that the flow diagram of FIG. 17 may combine one or more step and/or processes in order to simplify and/or clarify the method for providing an integrated device package. In some implementations, the order of the processes may be changed or modified.

The method provides (at 1705) a first package substrate. The first package substrate includes a dielectric layer (which may include several dielectric layers), a first set of pads, a second set of pads, and a third set of pads. The first package substrate may also include a set of solder balls. The first package substrate may include several interconnects (e.g., traces, vias, pads), which are not shown.

The method couples (at 1710) a first die to the first package substrate. The first die is coupled to the first package substrate through a first set of solder balls. Specifically, the first die is coupled to the first set of pads through the first set of solder balls. An underfill is provided and surrounds the first set of solder balls between the first die and the first package substrate.

The method couples (at 1715) at least one inter package connection to the first package substrate. In some implementations, the inter package connection may be similar to the inter package connections 250, 600, 800, 900, 1000, 1150, 1250, and/or 1320. The inter package connection may be coupled to the first package substrate by using an attach paste. In some implementations, the inter package connection is coupled to the first package substrate such that the inter package connection at least partially surrounds the first die. It should be noted that in some implementations, the inter package connection may be coupled to the first package substrate before the first die is coupled to the first package substrate.

The inter package connection includes a dielectric layer, a first set of interconnects, and a second set of interconnects. In some implementations, the first set of interconnects is one or more pieces of electrically conductive material (e.g., metal slab) that at least partially surrounds the first die. In some implementations, the second set of interconnects includes several vias (e.g., through encapsulation vias) that at least partially surrounds the first die. The second set of interconnects is located between the first set of interconnects and the first die. In some implementations, the first set of interconnects is configured to provide a first electrical path for a ground reference signal. In some implementations, the second set of interconnects is configured to provide a second electrical path for a power signal or input/output signal.

The method forms (at 1720) an encapsulation layer over the first package substrate, the first die, and the inter package connection. The encapsulation layer may include a mold, an epoxy, and/or a resin fill. In some implementations, portions of the encapsulation layer may be grinded (e.g., to expose interconnects, pads). A first package (e.g., first integrated device package) may be defined by the first package substrate, the first die, the inter package connection, and/or the encapsulation layer.

The method couples (at 1725) a second package (e.g., second integrated device package) to the first package. The second package includes a second die and a second package substrate. The second package substrate includes a dielectric layer (which may include several dielectric layers), a fourth set of pads, and a fifth set of pads. The second package substrate may include several interconnects (e.g., traces, pads, vias). The second die is coupled to the second package substrate through a fourth set of solder balls. Specifically, the second die is coupled to the fourth set of pads through the third set of solder balls. The fifth set of pads is coupled to the inter package connection.

Figure 18A:
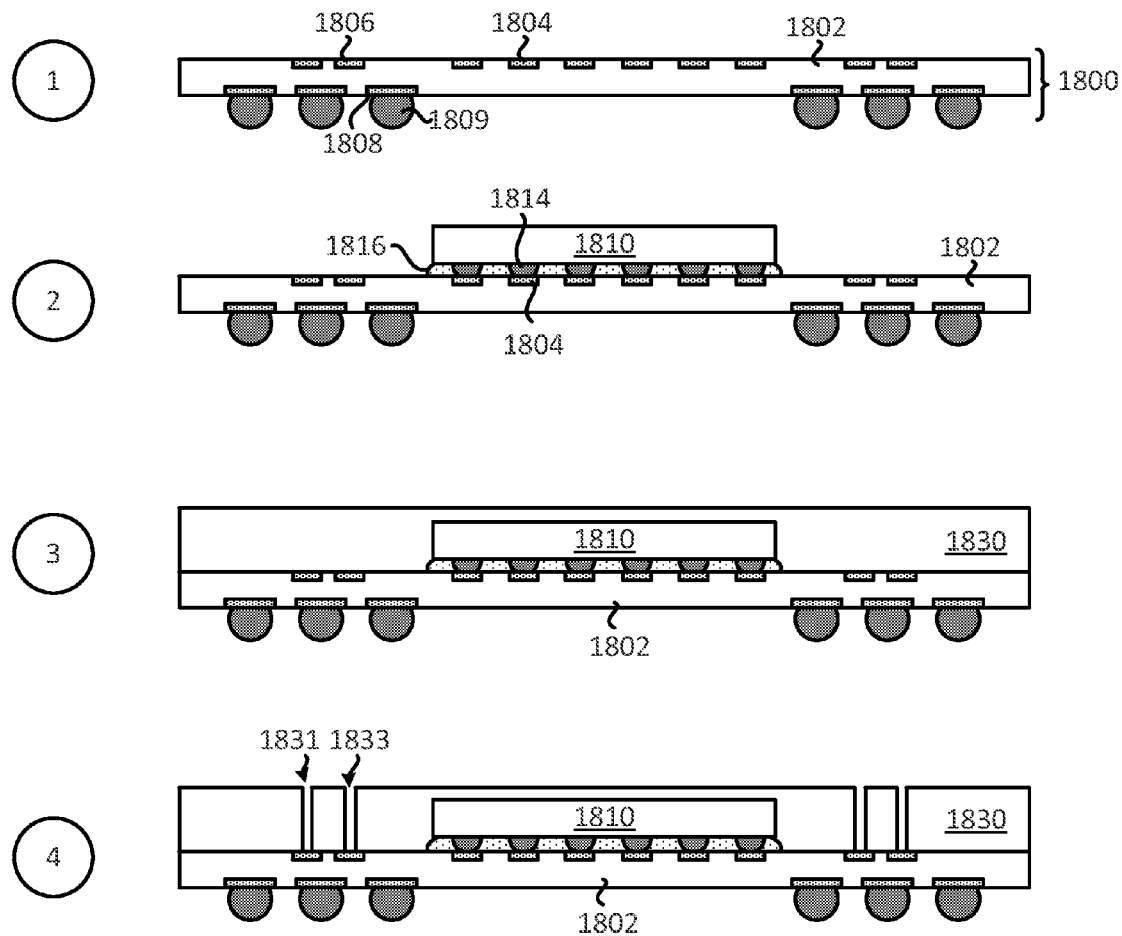
FIG. 18 (which includes FIGS. 18A-18B) illustrates an exemplary sequence for providing/fabricating a package on package (PoP) device that includes an inter package connection.
Figure 18B:
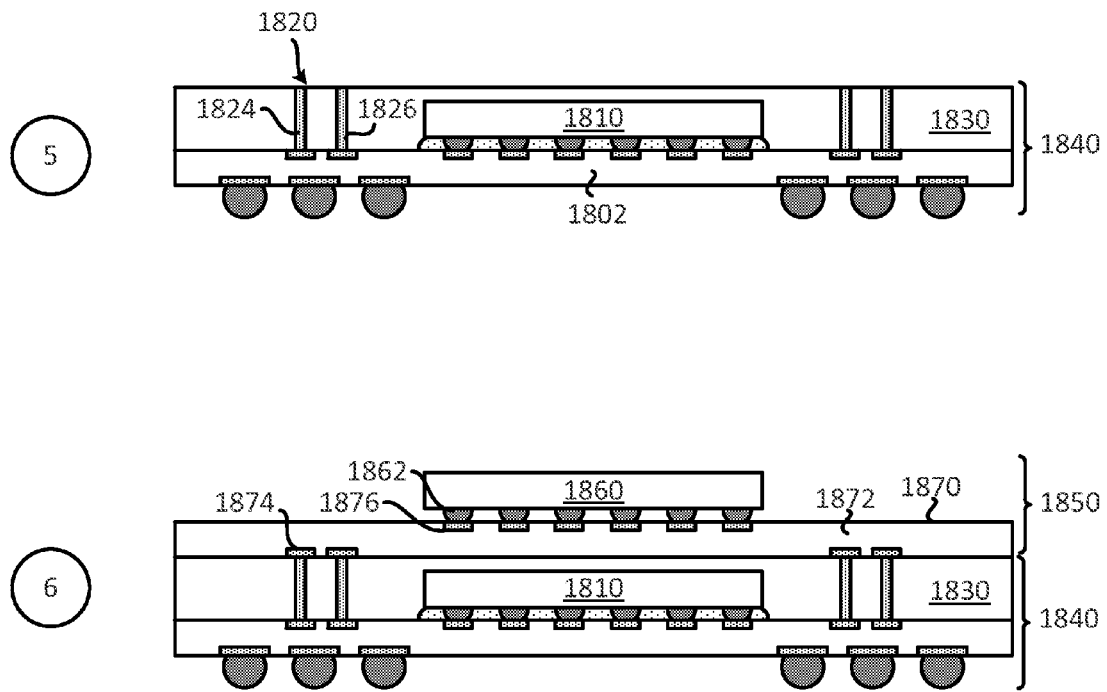

Exemplary Sequence for Providing/Fabricating a Package on Package (PoP) Device that Includes an Inter Package Connection In some implementations, providing/fabricating an package on package (PoP) device that includes an inter package connection includes several processes. FIG. 18 (which includes FIGS. 18A-18B) illustrates an exemplary sequence for providing/fabricating a package on package (PoP) device that includes an inter package connection. In some implementations, the sequence of FIGS. 18A-18B may be used to provide/fabricate the PoP device of FIGS. 2, 11-12 and/or other PoP devices in the present disclosure, such as FIGS. 6, and 8-10. However, for the purpose of simplification, FIG. 18A-18B will be described in the context of providing/fabricating an implementations of the PoP device of FIG. 12.

It should be noted that the sequence of FIG. 18 may combine one or more stages in order to simplify and/or clarify the sequence for providing an integrated device package. In some implementations, the order of the processes may be changed or modified.

Stage 1 as shown in FIG. 18A, illustrates a state after a first package substrate 1800 is provides. The first package substrate 1800 includes a dielectric layer 1802 (which may include several dielectric layers), a first set of pads 1804, a second set of pads 1806, and a third set of pads 1808. The first package substrate 1800 may also include a set of solder balls 1809. The first package substrate 1800 may include several interconnects (e.g., traces, vias, pads), which are not shown.

Stage 2 illustrates a state after a first die 1810 is coupled to the first package substrate 1800. The first die 1810 is coupled to the first package substrate 1800 through a first set of solder balls 1814. Specifically, the first die 1810 is coupled to the first set of pads 1804 through the first set of solder balls 1814. An underfill 1818 surrounds the first set of solder balls 1814.

Stage 3 illustrates a state after an encapsulation layer 1830 is formed over the first package substrate 1800 and the first die 1810. The encapsulation layer 1830 may include a mold, an epoxy, and/or a resin fill. In some implementations, portions of the encapsulation layer 1830 may be grinded (e.g., to expose interconnects, pads).

Stage 4 illustrates a state after several cavities (e.g., cavity 1831, cavity 1833) are formed in the encapsulation layer 1830. Different implementations may use different processes to form the cavities. For example, a laser process and/or an etching process (e.g., photo etching process) may be used to form the cavities in the encapsulation layer 1830.

Stage 5 as shown in FIG. 18B, illustrates a state after at least one inter package connection 1820 is formed in the encapsulation layer 1830. In some implementations, the inter package connection 1820 may be similar to the inter package connections 250, 600, 800, 900, 1000, 1150, 1250, and/or 1320. The inter package connection 1820 may be formed by providing one more metal layers in the cavities (e.g., cavity 1831, cavity 1833) of the encapsulation layer 1830. In some implementations, the inter package connection 1820 is formed in the encapsulation layer 1830 such that the inter package connection 1820 at least partially surrounds the first die 1810.

The inter package connection 1820 includes a dielectric layer 1822, a first set of interconnects 1824, and a second set of interconnects 1826. The first set of interconnects 1824 is formed in the cavity 1831, and the second set of interconnects 1826 is formed in the cavity 1833. In some implementations, the first set of interconnects 1824 is one or more pieces of electrically conductive material (e.g., metal slab) that at least partially surrounds the first die 1810. In some implementations, the second set of interconnects 1826 includes several vias (e.g., through encapsulation vias) that at least partially surrounds the first die 1810. The second set of interconnects 1826 is located between the first set of interconnects 1824 and the first die 1810. In some implementations, the first set of interconnects 1824 is configured to provide a first electrical path for a ground reference signal. In some implementations, the second set of interconnects 1826 is configured to provide a second electrical path for a power signal or input/output signal.

In some implementations, stage 5 illustrates a first package 1840 (e.g., first integrated device package) that include the first package substrate 1800, the first die 1810, the inter package connection 1820, and the encapsulation layer 1830.

Stage 6 illustrates a state after a second package 1850 (e.g., second integrated device package) is coupled to the first package 1840. The second package 1850 includes a second die 1860 and a second package substrate 1870. The second package substrate 1870 includes a dielectric layer 1872 (which may include several dielectric layers), a fourth set of pads 1874, and a fifth set of pads 1876. The second package substrate 1870 may include several interconnects (e.g., traces, pads, vias). The second die 1860 is coupled to the second package substrate 1870 through a fourth set of solder balls 1862. Specifically, the second die 1860 is coupled to the fourth set of pads 1874 through the third set of solder balls 1862. The fifth set of pads 1876 is coupled to the inter package connection 1820.

Figure 19:
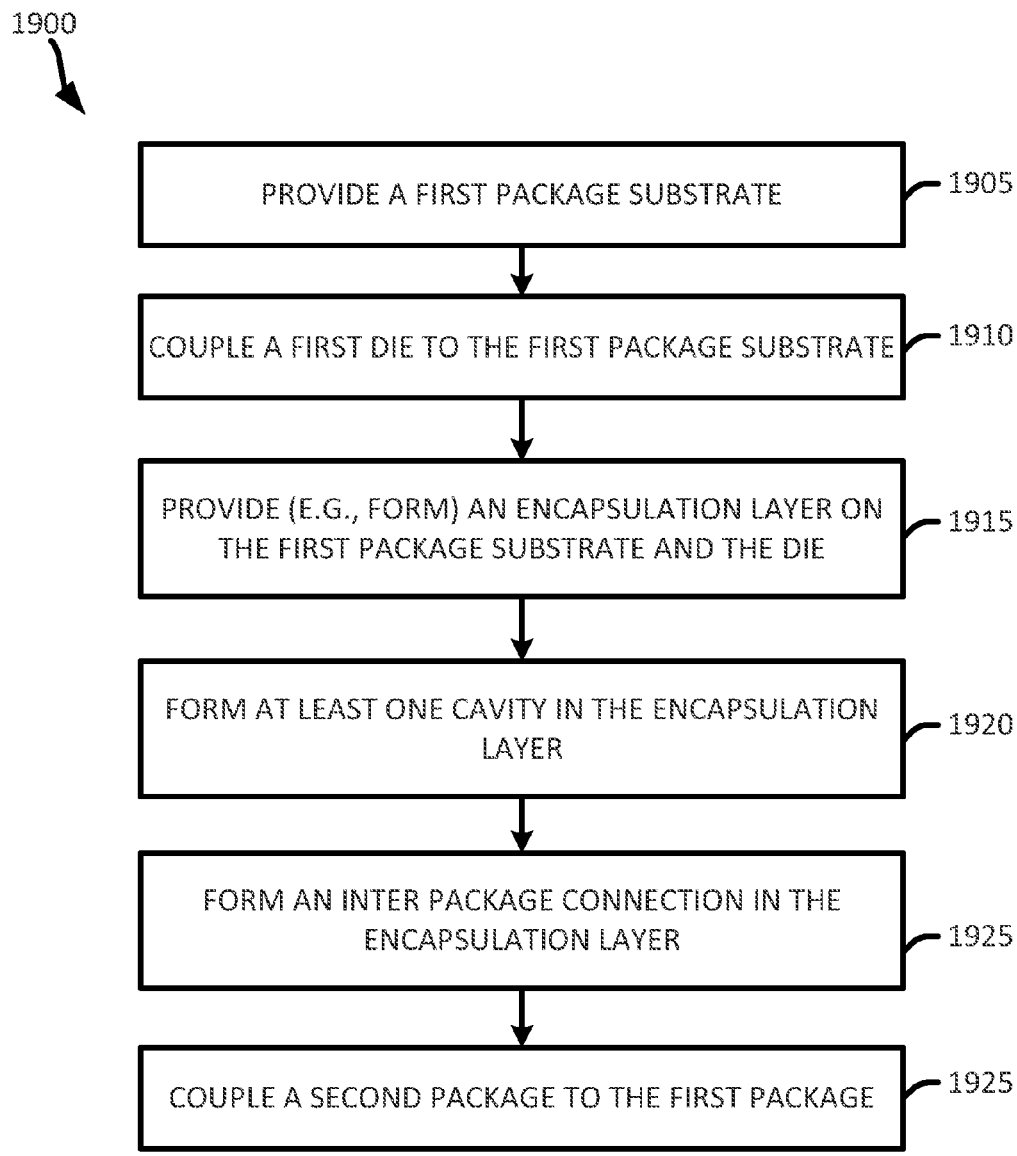
FIG. 19 illustrates an exemplary flow diagram of a method for providing/fabricating a package on package (PoP) device that includes an inter package connection.

Exemplary Method for Providing/Fabricating a Package on Package (PoP) Device that Includes an Inter Package Connection FIG. 19 illustrates an exemplary flow diagram of a method 1900 for providing/fabricating a package on package (PoP) device that includes an inter package connection. In some implementations, the method of FIG. 19 may be used to provide/fabricate the integrated device package of FIG. 2, 10-12 and/or other PoP devices in the present disclosure.

It should be noted that the flow diagram of FIG. 19 may combine one or more step and/or processes in order to simplify and/or clarify the method for providing an integrated device package. In some implementations, the order of the processes may be changed or modified.

The method provides (at 1905) a first package substrate (e.g. 222). The first package substrate includes a dielectric layer (which may include several dielectric layers), a first set of pads, a second set of pads, and a third set of pads. The first package substrate may also include a set of solder balls. The first package substrate may include several interconnects (e.g., traces, vias, pads), which are not shown.

The method couples (at 1910) a first die (e.g. 220) to the first package substrate. The first die is coupled to the first package substrate through a first set of solder balls. Specifically, the first die is coupled to the first set of pads through the first set of solder balls. An underfill (e.g. 1818) is provided and surrounds the first set of solder balls between the first die and the first package substrate.

The method forms (at 1915) an encapsulation layer (e.g. 260) over the first package substrate and the first die. The encapsulation layer may include a mold, an epoxy, and/or a resin fill. In some implementations, portions of the encapsulation layer may be grinded (e.g., to expose interconnects, pads).

The method forms (at 1920) several cavities in the encapsulation layer. Different implementations may use different processes to form the cavities. For example, a laser process and/or an etching process (e.g., photo etching process) may be used to form the cavities in the encapsulation layer.

The method forms (at 1925) at least one inter package connection in the encapsulation layer. In some implementations, the inter package connection may be similar to the inter package connections 250, 600, 800, 900, 1000, 1150, 1250, and/or 1320. The inter package connection may be formed by providing one more metal layers in the cavities of the encapsulation layer. In some implementations, the inter package connection is formed in the encapsulation layer such that the inter package connection at least partially surrounds the first die.

The inter package connection includes a first set of interconnects and a second set of interconnects. In some implementations, the first set of interconnects is one or more pieces of electrically conductive material (e.g., metal slab) that at least partially surrounds the first die. In some implementations, the second set of interconnects includes several vias (e.g., through encapsulation vias) that at least partially surrounds the first die. The second set of interconnects is located between the first set of interconnects and the first die. In some implementations, the first set of interconnects is configured to provide a first electrical path for a ground reference signal. In some implementations, the second set of interconnects is configured to provide a second electrical path for a power signal or input/output signal.

A first package (e.g., first integrated device package) may be defined by the first package substrate (e.g. 222), the first die (e.g. 220), the inter package connection (e.g. 250), and/or the encapsulation layer (e.g. 260).

The method couples (at 1930) a second package (e.g., second integrated device package, for example 242) to the first package. The second package includes a second die (e.g. 240) and a second package substrate. The second package substrate includes a dielectric layer (which may include several dielectric layers), a fourth set of pads, and a fifth set of pads. The second package substrate may include several interconnects (e.g., traces, pads, vias). The second die is coupled to the second package substrate through a fourth set of solder balls. Specifically, the second die is coupled to the fourth set of pads through the third set of solder balls. The fifth set of pads is coupled to the inter package connection.

Exemplary Semi-Additive Patterning (SAP) Process

Various interconnects (e.g., traces, vias, pads) are described in the present disclosure. These interconnects may be formed in the encapsulation layer and the package substrate. In some implementations, these interconnects may include one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes. Some of these interconnects may represent for example, interconnect 254, interconnect 256, or interconnect 602 as described above.

Different implementations may use different processes to form and/or fabricate the metal layers (e.g., interconnects, redistribution layer, under bump metallization layer). In some implementations, these processes include a semi-additive patterning (SAP) process and a damascene process. These various different processes are further described below.

Figure 20:
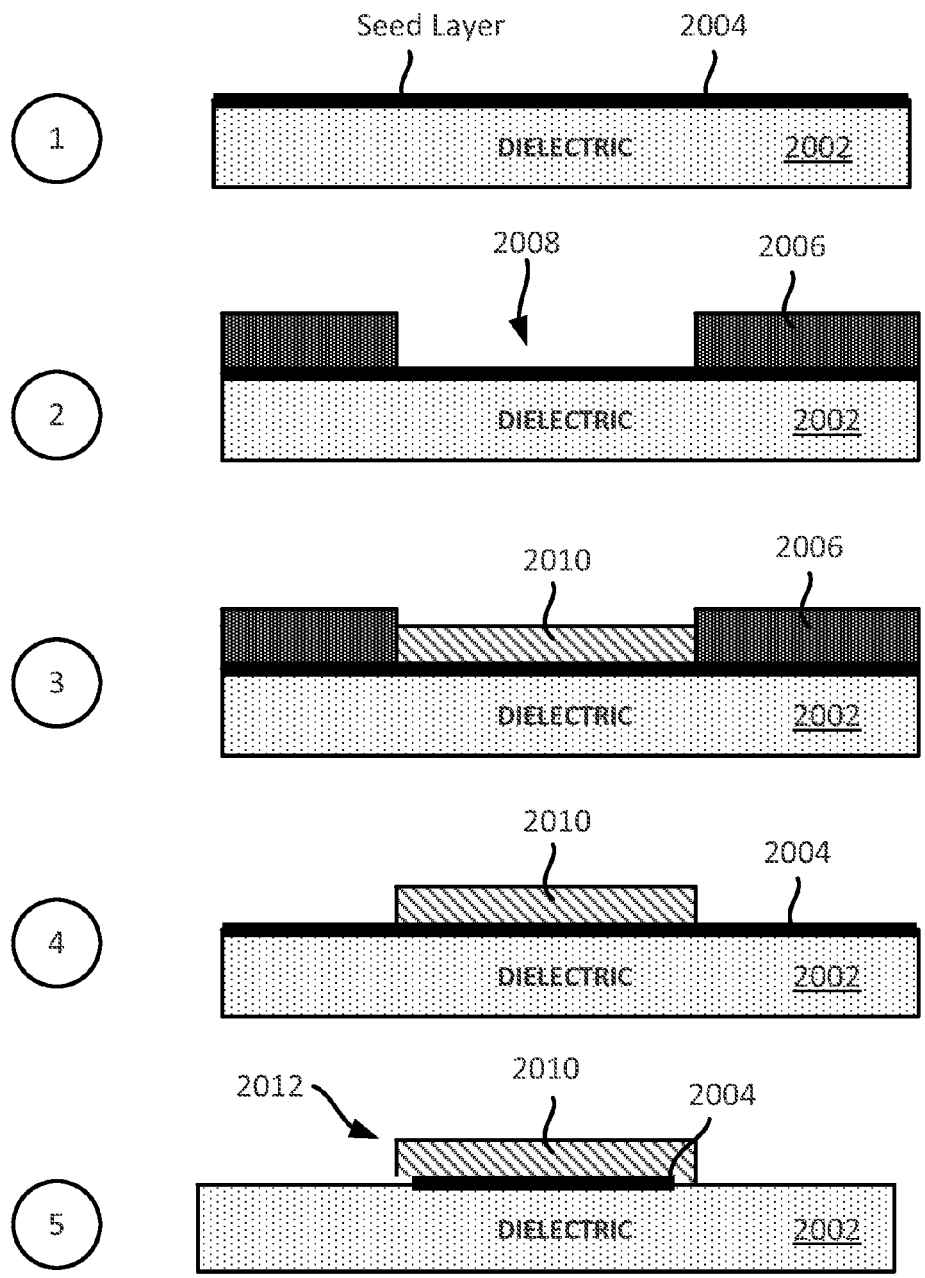
FIG. 20 illustrates an example of a semi-additive patterning (SAP) process.

FIG. 20 illustrates a sequence for forming an interconnect using a semi-additive patterning (SAP) process to provide and/or form an interconnect in one or more dielectric layer(s) and/or encapsulation layer. As shown in FIG. 20, stage 1 illustrates a state of an integrated device (e.g., substrate) after a dielectric layer 2002 is provided (e.g., formed). In some implementations, stage 1 illustrates that the dielectric layer 2002 includes a first metal layer 2004. The first metal layer 2004 is a seed layer in some implementations. In some implementations, the first metal layer 2004 may be provided (e.g., formed) on the dielectric layer 2002 after the dielectric layer 2002 is provided (e.g., received or formed). Stage 1 illustrates that the first metal layer 2004 is provided (e.g., formed) on a first surface of the dielectric layer 2002. In some implementations, the first metal layer 2004 is provided by using a deposition process (e.g., PVD, CVD, plating process).

Stage 2 illustrates a state of the integrated device after a photo resist layer 2006 (e.g., photo develop resist layer) is selectively provided (e.g., formed) on the first metal layer 2004. In some implementations, selectively providing the photo resist layer 2006 includes providing a first photo resist layer 2006 on the first metal layer 2004 and selectively removing portions of the photo resist layer 2006 by developing (e.g., using a development process). Stage 2 illustrates that the photo resist layer 2006 is provided such that a cavity 2008 is formed.

Stage 3 illustrates a state of the integrated device after a second metal layer 2010 is formed in the cavity 2008. In some implementations, the second metal layer 2010 is formed over an exposed portion of the first metal layer 2004. In some implementations, the second metal layer 2010 is provided by using a deposition process (e.g., plating process).

Stage 4 illustrates a state of the integrated device after the photo resist layer 2006 is removed. Different implementations may use different processes for removing the photo resist layer 2006.

Stage 5 illustrates a state of the integrated device after portions of the first metal layer 2004 are selectively removed. In some implementations, one or more portions of the first metal layer 2004 that is not covered by the second metal layer 2010 are removed. As shown in stage 5, the remaining first metal layer 2004 and the second metal layer 2010 may form and/or define an interconnect 2012 (e.g., trace, vias, pads) in an integrated device and/or a substrate. In some implementations, the first metal layer 2004 is removed such that a dimension (e.g., length, width) of the first metal layer 2004 underneath the second metal layer 2010 is about the same or smaller than a dimension (e.g., length, width) of the second metal layer 2010, which can result in an undercut, as shown at stage 5 of FIG. 20. In some implementations, the above mentioned processes may be iterated several times to provide and/or form several interconnects in one or more dielectric layers of an integrated device and/or substrate.

Figure 21:
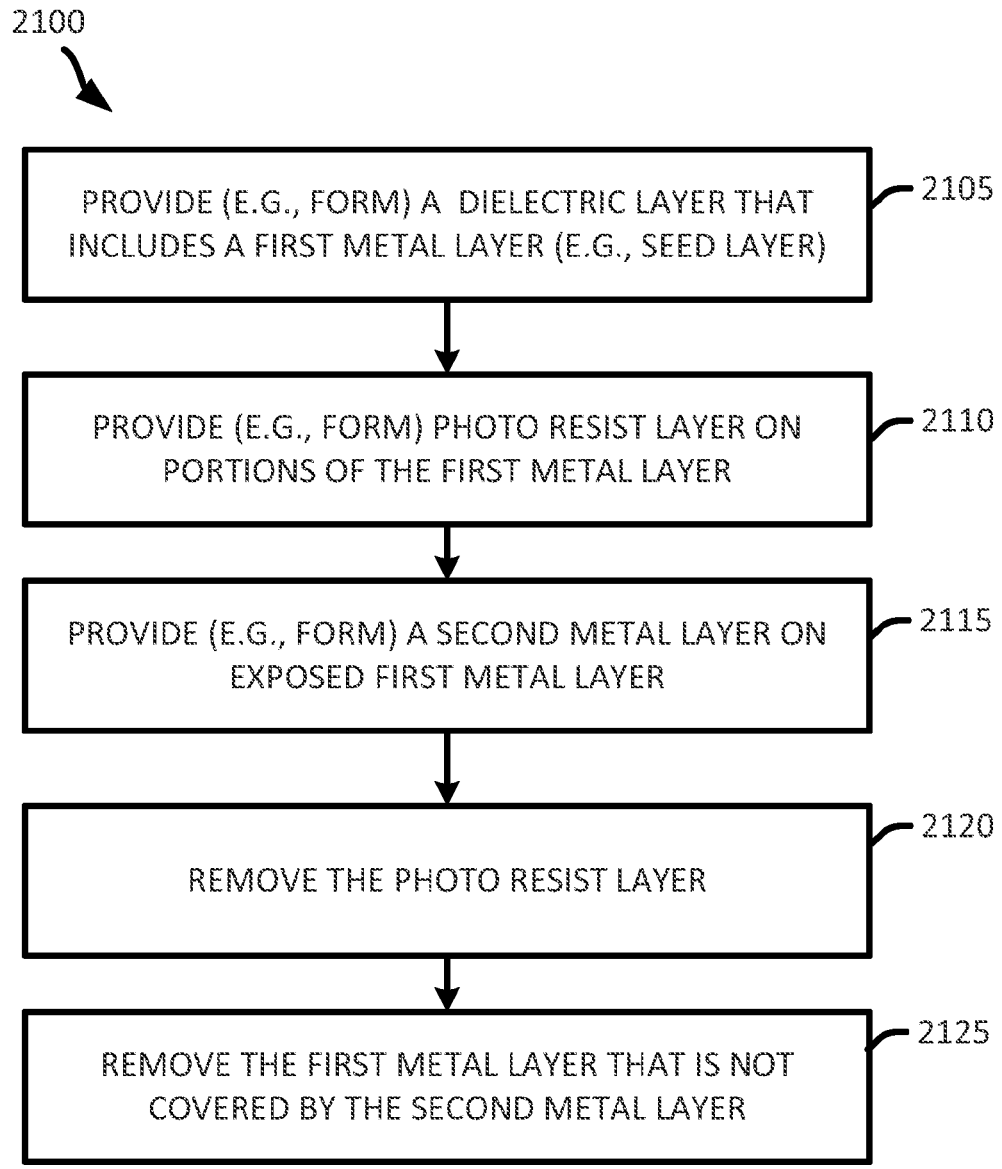
FIG. 21 illustrates an example of flow diagram of a semi-additive patterning (SAP) process.

FIG. 21 illustrates a flow diagram for a method for using a (SAP) process to provide and/or form an interconnect in one or more dielectric layer(s). The method provides (at 2105) a dielectric layer (e.g., dielectric layer 2002). In some implementations, providing the dielectric layer includes forming the dielectric layer. In some implementations, providing the dielectric layer includes forming a first metal layer (e.g., first metal layer 2004). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 2110) a photo resist layer (e.g., a photo develop resist layer 2006) on the first metal layer. In some implementations, selectively providing the resist layer includes providing a first resist layer on the first metal layer and selectively removing portions of the resist layer (which provides one or more cavities).

The method then provides (at 2115) a second metal layer (e.g., second metal layer 2010) in the cavity of the photo resist layer. In some implementations, the second metal layer is formed over an exposed portion of the first metal layer. In some implementations, the second metal layer is provided by using a deposition process (e.g., plating process).

The method further removes (at 2120) the resist layer. Different implementations may use different processes for removing the resist layer. The method also selectively removes (at 2125) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 22:
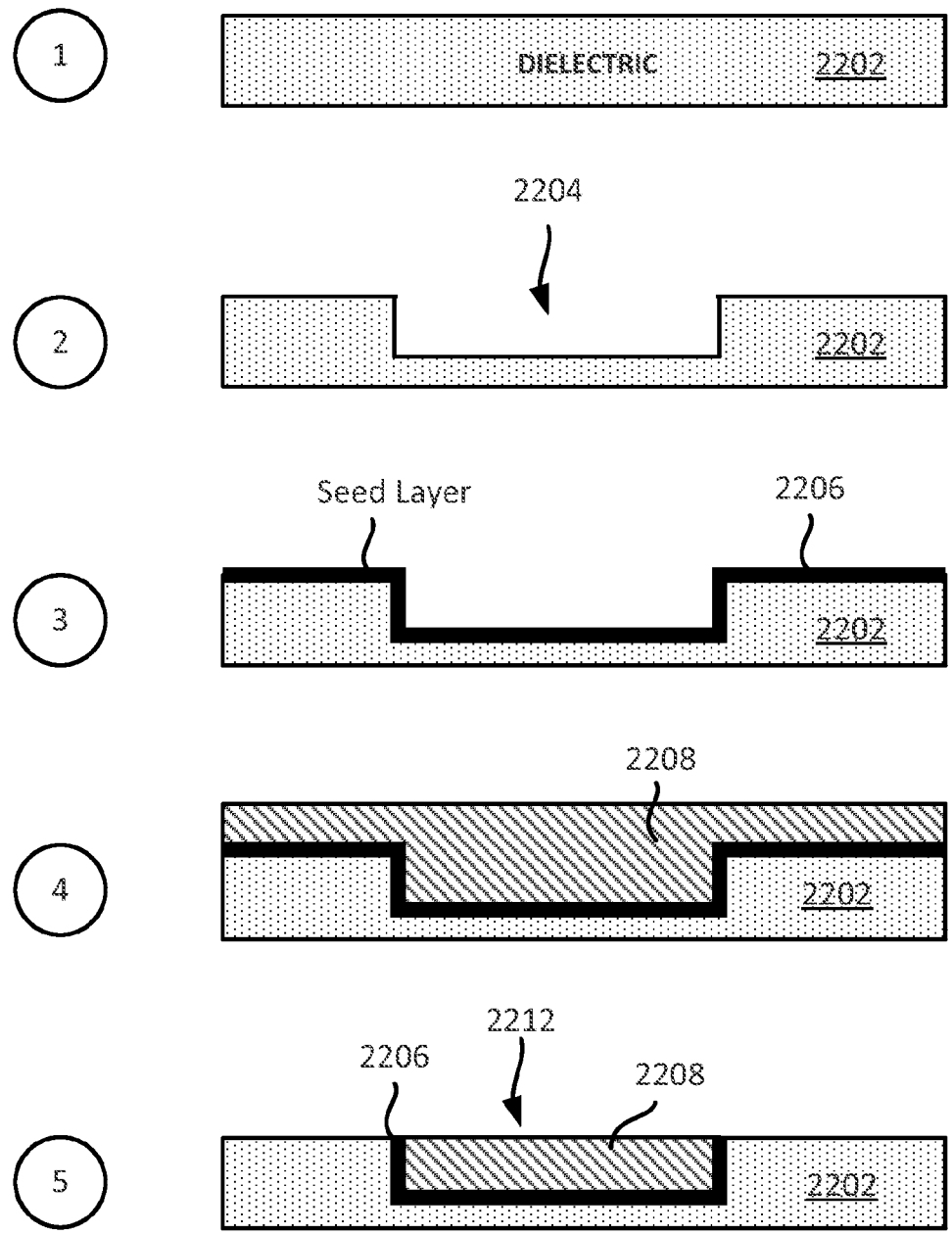
FIG. 22 illustrates an example of a damascene process.

FIG. 22 illustrates a sequence for forming an interconnect using a damascene process to provide and/or form an interconnect in a dielectric layer and/or an encapsulation layer. As shown in FIG. 22, stage 1 illustrates a state of an integrated device after a dielectric layer 2202 is provided (e.g., formed). In some implementations, the dielectric layer 2202 is an inorganic layer (e.g., inorganic film). In some implementations, the dielectric layer 2202 may be replaced with an encapsulation layer.

Stage 2 illustrates a state of an integrated device after a cavity 2204 is formed in the dielectric layer 2202. Different implementations may use different processes for providing the cavity 2204 in the dielectric layer 2202.

Stage 3 illustrates a state of an integrated device after a first metal layer 2206 is provided on the dielectric layer 2202. As shown in stage 3, the first metal layer 2206 provided on a first surface of the dielectric layer 2202. The first metal layer 2206 is provided on the dielectric layer 2202 such that the first metal layer 2206 takes the contour of the dielectric layer 2202 including the contour of the cavity 2204. The first metal layer 2206 is a seed layer in some implementations. In some implementations, the first metal layer 2206 is provided by using a deposition process (e.g., physical vapor deposition (PVD), Chemical Vapor Deposition (CVD) or plating process).

Stage 4 illustrates a state of the integrated device after a second metal layer 2208 is formed in the cavity 2204 and a surface of the dielectric layer 2202. In some implementations, the second metal layer 2208 is formed over an exposed portion of the first metal layer 2206. In some implementations, the second metal layer 2208 is provided by using a deposition process (e.g., plating process).

Stage 5 illustrates a state of the integrated device after the portions of the second metal layer 2208 and portions of the first metal layer 2206 are removed. Different implementations may use different processes for removing the second metal layer 2208 and the first metal layer 2206. In some implementations, a chemical mechanical planarization (CMP) process is used to remove portions of the second metal layer 2208 and portions of the first metal layer 2206. As shown in stage 5, the remaining first metal layer 2206 and the second metal layer 2208 may form and/or define an interconnect 2212 (e.g., trace, vias, pads) in an integrated device and/or a substrate. As shown in stage 5, the interconnect 2212 is formed in such a way that the first metal layer 2206 is formed on the base portion and the side portion(s) of the second metal layer 2210. In some implementations, the cavity 2204 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

Figure 23:
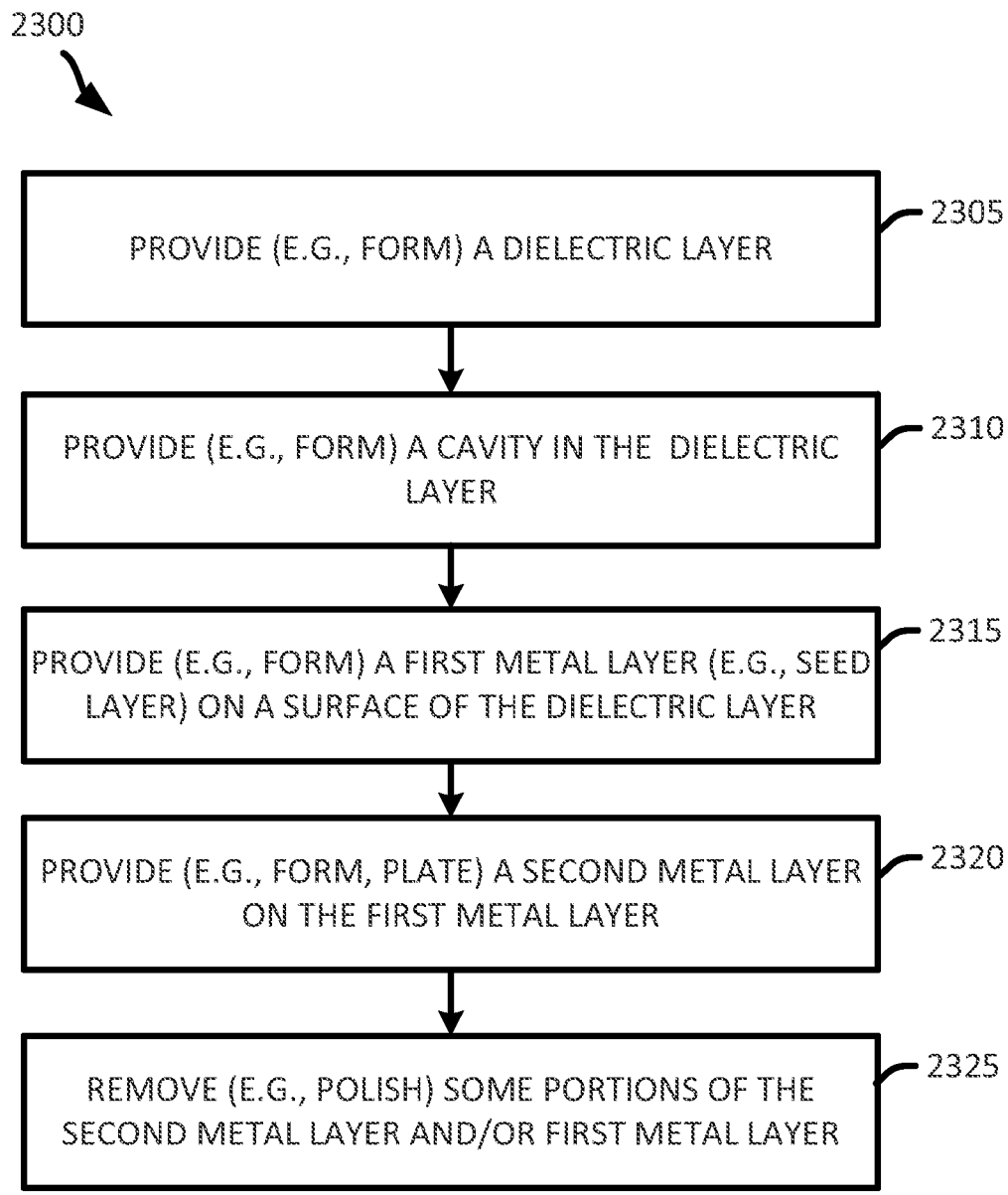
FIG. 23 illustrates an example of a flow diagram of a damascene process.

FIG. 23 illustrates a flow diagram of a method 2300 for forming an interconnect (e.g. 2012) using a damascene process to provide and/or form an interconnect in a dielectric layer. The method provides (at 2305) a dielectric layer (e.g., dielectric layer 2202). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 2310) at least one cavity (e.g., cavity 2204) in the dielectric layer. Different implementations may use different processes for providing the cavity in the dielectric layer.

The method provides (at 2315) a first metal layer (e.g., first metal layer 2206) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 2206 is provided by using a deposition process (e.g., PVD, CVD or plating process).

The method provides (at 2320) a second metal layer (e.g., second metal layer 2208) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 2325) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer (e.g. 2206) and the second metal layer may form and/or define an interconnect (e.g., interconnect 2212). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 24:
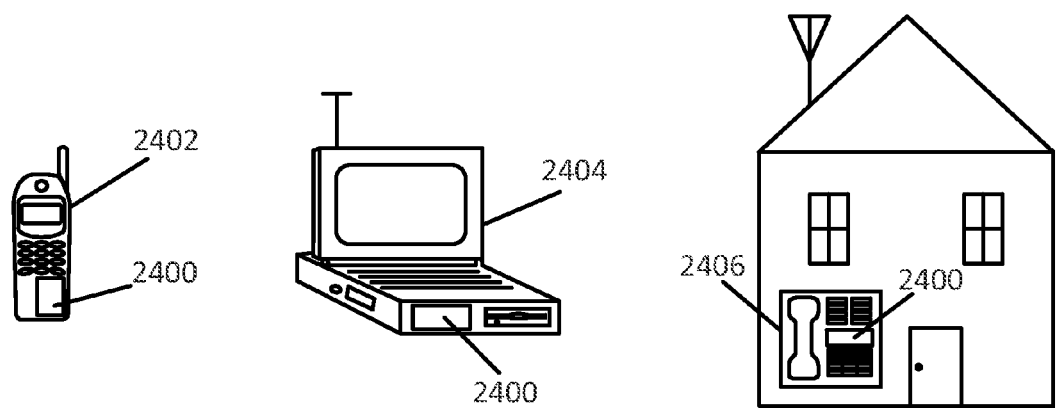
FIG. 24 illustrates various electronic devices that may integrate a package on package (PoP) device, an integrated package, a semiconductor device, a die, an integrated circuit and/or printed circuit board (PCB) described herein.

FIG. 24 illustrates various electronic devices that may be integrated with any of the aforementioned integrated device, semiconductor device, integrated circuit, die, interposer, package or package-on-package (PoP). For example, a mobile telephone 2402, a laptop computer 2404, and a fixed location terminal 2406 may include an integrated device 2400 as described herein. The integrated device 2400 may be, for example, any of the integrated circuits, dice, packages, package-on-packages described herein. The devices 2402, 2404, 2406 illustrated in FIG. 24 are merely exemplary. Other electronic devices may also feature the integrated device 2400 including, but not limited to, mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14, 15, 16, 17, 18A-18B, 19, 20, 21, 22, 23, and/or 24 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13, 14, 15, 16, 17, 18A-18B, 19, 20, 21, 22, 23, and/or 24 and its corresponding description in the present disclosure is not limited to dies and/or ICs. In some implementations, FIGS. 2, 3, 4, 5, 6, 7, 8, 9, 10, 11, 12, 13, 14, 15, 16, 17, 18A-18B, 19, 20, 21, 22,

23, and/or 24 and its corresponding description may be used to manufacture, create, provide, and/or produce integrated devices. In some implementations, a device may include a die, a die package, an integrated circuit (IC), an integrated device, an integrated device package, a wafer, a semiconductor device, a package on package, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

A 'set' of objects may include one or more objects. For example, a set of interconnects may include one or more interconnects. A set of solder balls may include one or more solder balls. A set of vias may include one or more vias.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device package comprising:
    a first package substrate;
    a first die coupled to the first package substrate;
    an encapsulation layer located on the first package substrate; and
    an inter package connection coupled to the first package substrate, the inter package connection located at least partially in the encapsulation layer, the inter package connection comprising:
        a first interconnect providing a first electrical path for a reference ground signal, wherein the first interconnect comprises a plurality of discrete interconnects that are substantially rectangularly shaped and wherein each of the plurality of discrete interconnects has a length that is at least about twice as long as a width; and
        a second interconnect configured to provide at least one second electrical path for at least one second signal, wherein the second interconnect is configured to at least be partially coupled to the first interconnect by an electric field.

2. The integrated device package of claim 1, wherein the second interconnect includes one of at least a row of interconnects and/or a column of interconnects.

3. The integrated device package of claim 1, wherein the first interconnect is substantially parallel to at least one of an adjacent row or adjacent column of interconnects from the second interconnect.

4. The integrated device package of claim 1, wherein the length of the first interconnect is at least about eighty percent of a length of a first side of the first die.

5. The integrated device package of claim 1, wherein the first interconnect substantially surrounds the first die.

6. The integrated device package of claim 1, wherein the inter package connection further includes a third interconnect comprising at least two discrete interconnects that are substantially rectangularly shaped and configured to provide the first electrical path for the reference ground signal.

7. The integrated device package of claim 6, wherein the first and third interconnects at least partially surround the second interconnect, and wherein at least two of the plurality of discrete interconnects of the first interconnect are substantially linearly aligned with each other.

8. The integrated device package of claim 1, wherein at least one of the plurality of discrete interconnects is positioned in the encapsulation layer along at least a substantial portion of a first side of the first die.

9. The integrated device package of claim 1, wherein the second interconnect is configured to provide several electrical paths for different second signals.

10. The integrated device package of claim 1, wherein the inter package connection is an inter package coaxial connection.

11. The integrated device package of claim 1, wherein the second interconnect is configured to at least be partially coupled to the first interconnect by an electric field when at least one second signal traverses at least one interconnect from the second interconnect.

12. The integrated device package of claim 1, wherein the integrated device package is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, and a laptop computer, and further including the device.

13. An integrated device package comprising:
    a first package substrate;
    a first die coupled to the first package substrate;
    an encapsulation layer located on the first package substrate; and
    an inter package connection coupled to the first package substrate, the inter package connection located at least partially in the encapsulation layer, the inter package connection comprising:
        a first interconnect providing a first electrical path for a reference ground signal, wherein the first interconnect comprises a plurality of discrete interconnects that are substantially rectangularly shaped and wherein each of the plurality of discrete interconnects has a length that is at least about twice as long as a width; and
        an electrical vertical coupling means configured to provide at least one second electrical path for at least one second signal, wherein the first interconnect and the electrical vertical coupling means are positioned in the encapsulation layer.

14. The integrated device package of claim 13, wherein the inter package connection comprises a dielectric layer and a second interconnect comprising at least two discrete interconnects that are substantially rectangularly shaped and configured to provide the first electrical path for the reference ground signal.

15. The integrated device package of claim 14, wherein the dielectric layer includes one of at least a silicon material and/or a glass material.

16. The integrated device package of claim 13, wherein the first interconnect substantially surrounds the first die, and wherein at least two interconnects of the first interconnect are substantially linearly aligned with each other.

17. The integrated device package of claim 13, wherein the inter package connection is an inter package coaxial connection means.

18. The integrated device package of claim 13, wherein the integrated device package is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, and a laptop computer, and further including the device.

19. A package on package (PoP) device comprising:
  a first integrated device package comprising:
    a first package substrate;
    a first die coupled to the first package substrate;
    an encapsulation layer located on the first package substrate; and
    an inter package connection coupled to the first package substrate, the inter package connection located at least partially in the encapsulation layer, the inter package connection comprising:
      a first interconnect providing a first electrical path for a reference ground signal, wherein the first interconnect comprises a plurality of discrete interconnects that are substantially rectangularly shaped and wherein each of the plurality of discrete interconnects has a length that is at least about twice as long as a width; and
      a second interconnect configured to provide at least one second electrical path for at least one second signal, wherein the second interconnect is further configured to at least be partially coupled to the first interconnect by an electric field; and
  a second package substrate coupled to the first integrated device package.

20. The PoP device of claim 19, further comprising a second die coupled to the second package substrate.

21. The PoP device of claim 19, wherein the second interconnect includes one of at least a row of interconnects and/or a column of interconnects.

22. The PoP device of claim 19, wherein the inter package connection at least partially surrounds the first die and further comprises a third interconnect comprising at least two discrete interconnects that are substantially rectangularly shaped and configured to provide the first electrical path for the reference ground signal.

23. The PoP device of claim 19, wherein the PoP device is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, and a laptop computer, and further including the device.

24. A method for fabricating an integrated device, comprising:
  fabricating a first integrated device package, comprising:
    providing a first package substrate;
    coupling a first die to the first package substrate;
    forming an encapsulation layer on the first package substrate; and
    providing an inter package connection to the first package substrate and at least partially in the encapsulation layer, wherein providing the inter package connection comprises:
      forming a first interconnect in the encapsulation layer, wherein the first interconnect is formed to comprise a plurality of discrete interconnects that are substantially rectangularly shaped with each of the plurality of discrete interconnects having a length that is at least about twice as long as a width, the first interconnect being formed to provide a first electrical path for a reference ground signal; and
      forming a second interconnect in the encapsulation layer, wherein the second interconnect is formed to provide at least one second electrical path for at least one second signal, wherein the second interconnect is formed to at least be partially coupled to the first interconnect by an electric field.

25. The method of claim 24 further comprising coupling a second integrated device package to the first integrated device package, wherein coupling the second integrated device package comprises:
  providing a second package substrate; and
  coupling a second die to the second package substrate.

26. The method of claim 24, wherein providing the inter package connection further comprises forming a dielectric layer.

27. The method of claim 26, wherein the dielectric layer includes one of at least a silicon material and/or a glass material.

28. The method of claim 24, wherein providing the inter package connection comprises providing the inter package connection to at least partially surround the first die.

29. The method of claim 24, wherein the inter package connection is an inter package coaxial connection.

30. The method of claim 24, wherein the integrated device is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, and a laptop computer, and further including the device.

* * * * *